(12) United States Patent
Fang et al.

(10) Patent No.: US 12,364,036 B2
(45) Date of Patent: Jul. 15, 2025

(54) GERMANIUM-BASED PHOTODETECTOR WITH REDUCED DARK CURRENT

(71) Applicant: Taiwan Semiconductor Manufacturing Company Limited, Hsinchu (TW)

(72) Inventors: Yeh-Hsun Fang, Taipei (TW); Zhi-Wei Zhuang, Hsinchu (TW); Li-Hsin Chu, New Taipei (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 544 days.

(21) Appl. No.: 17/460,176

(22) Filed: Aug. 28, 2021

(65) Prior Publication Data

US 2023/0066085 A1    Mar. 2, 2023

(51) Int. Cl.
*H10F 30/22* (2025.01)
*G01S 7/481* (2006.01)
(Continued)

(52) U.S. Cl.
CPC ........ *H10F 39/8033* (2025.01); *G01S 7/4816* (2013.01); *G01S 17/894* (2020.01);
(Continued)

(58) Field of Classification Search
CPC ............. H01L 27/1461; H01L 27/1462; H01L 27/14627; H01L 27/14649;
(Continued)

(56) References Cited

U.S. PATENT DOCUMENTS

| 5,461,246 A | * | 10/1995 | Chou | ................. H01L 31/1085 |
| | | | | 257/E31.066 |
| 2009/0045346 A1 | * | 2/2009 | Von Kanel | ........ H01L 27/14689 |
| | | | | 250/370.09 |

(Continued)

FOREIGN PATENT DOCUMENTS

TW    202118036 A    5/2021

OTHER PUBLICATIONS

Taiwanese Patent and Trademark Office, Application No. 110148996, Office Action, mailed Oct. 5, 2022, 8 pages.

*Primary Examiner* — Yara B Green
*Assistant Examiner* — Christopher M Roland
(74) *Attorney, Agent, or Firm* — The Marbury Law Group, PLLC

(57) ABSTRACT

A photodetector including a substrate having a semiconductor material layer, such as a silicon-containing layer, and a germanium-based well embedded in the semiconductor material layer, where a gap is located between a lateral side surface of the germanium-based well and the surrounding semiconductor material layer. The gap between the lateral side surface of the germanium-based well and the surrounding semiconductor material layer may reduce the surface contact area between the germanium-containing material of the well and the surrounding semiconductor material, which may be a silicon-based material. The formation of the gap located between a lateral side surface of the germanium-based well and the surrounding semiconductor material layer may help minimize the formation of crystal defects, such as slips, in the germanium-based well, and thereby reduce the dark current and improve photodetector performance.

20 Claims, 20 Drawing Sheets

(51) Int. Cl.
*G01S 17/894* (2020.01)
*H10F 39/00* (2025.01)
*H10F 39/18* (2025.01)
*H10F 71/00* (2025.01)
*H10F 77/122* (2025.01)
*H10F 77/14* (2025.01)

(52) U.S. Cl.
CPC ........... *H10F 30/22* (2025.01); *H10F 39/014* (2025.01); *H10F 39/184* (2025.01); *H10F 39/8027* (2025.01); *H10F 39/805* (2025.01); *H10F 39/8063* (2025.01); *H10F 71/00* (2025.01); *H10F 77/122* (2025.01); *H10F 77/14* (2025.01)

(58) Field of Classification Search
CPC ............. H01L 27/14689; H01L 31/102; H01L 27/14607; H01L 27/14683; H01L 31/18; H01L 31/028; H01L 31/0352; G01S 7/4816; G01S 17/894; H10F 30/22; H10F 39/184; H10F 39/8027; H10F 39/8033; H10F 77/122; H10F 77/14

See application file for complete search history.

(56) References Cited

U.S. PATENT DOCUMENTS

| | | | |
|---|---|---|---|
| 2011/0037133 A1* | 2/2011 | Su | H01L 31/1808 257/E31.127 |
| 2014/0225214 A1 | 8/2014 | King et al. | |
| 2015/0001665 A1* | 1/2015 | Kautzsch | H01L 31/0352 257/436 |
| 2018/0233521 A1* | 8/2018 | Na | G01S 7/4914 |
| 2019/0140133 A1* | 5/2019 | Chen | H10F 71/139 |
| 2020/0176503 A1* | 6/2020 | Ouvrier-Buffet | H01L 31/1804 |
| 2021/0217912 A1* | 7/2021 | Jacob | H01L 31/105 |
| 2021/0242354 A1* | 8/2021 | Wang | H01L 31/1804 |
| 2021/0320217 A1* | 10/2021 | Levy | H01L 31/028 |
| 2021/0376180 A1* | 12/2021 | Adusumilli | H01L 31/03125 |
| 2024/0178337 A1* | 5/2024 | Lin | H01L 31/1013 |
| 2024/0405035 A1* | 12/2024 | Fang | H01L 27/14649 |

* cited by examiner

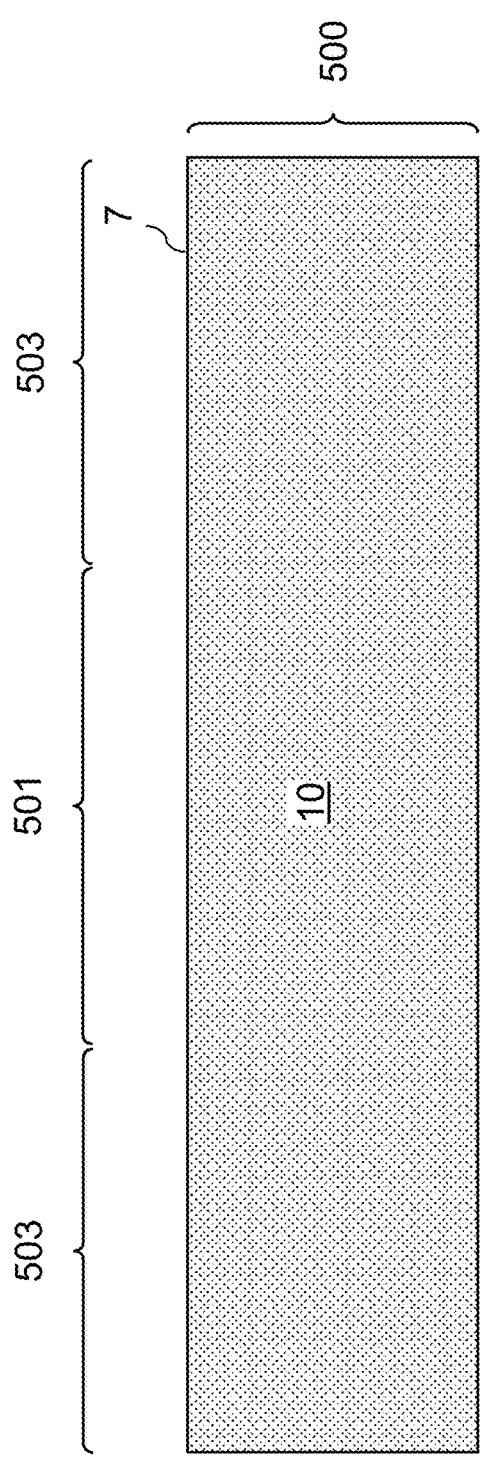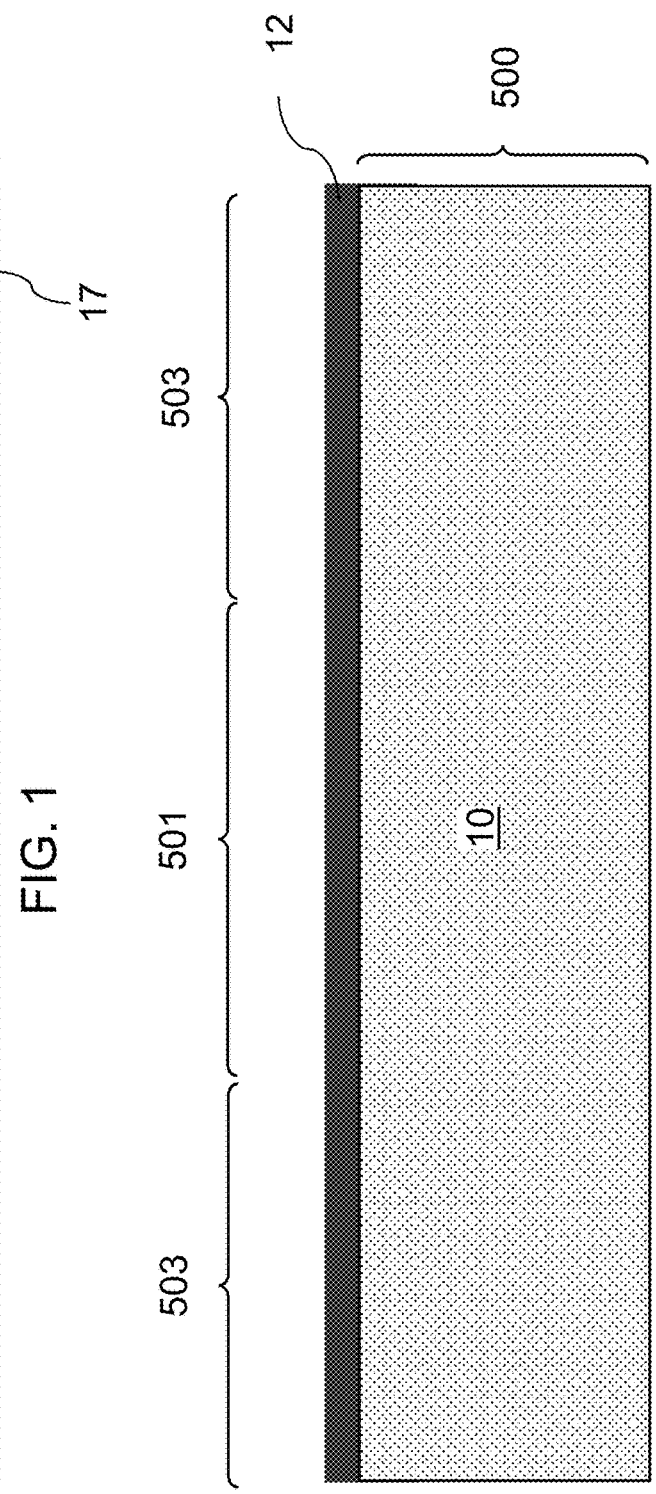

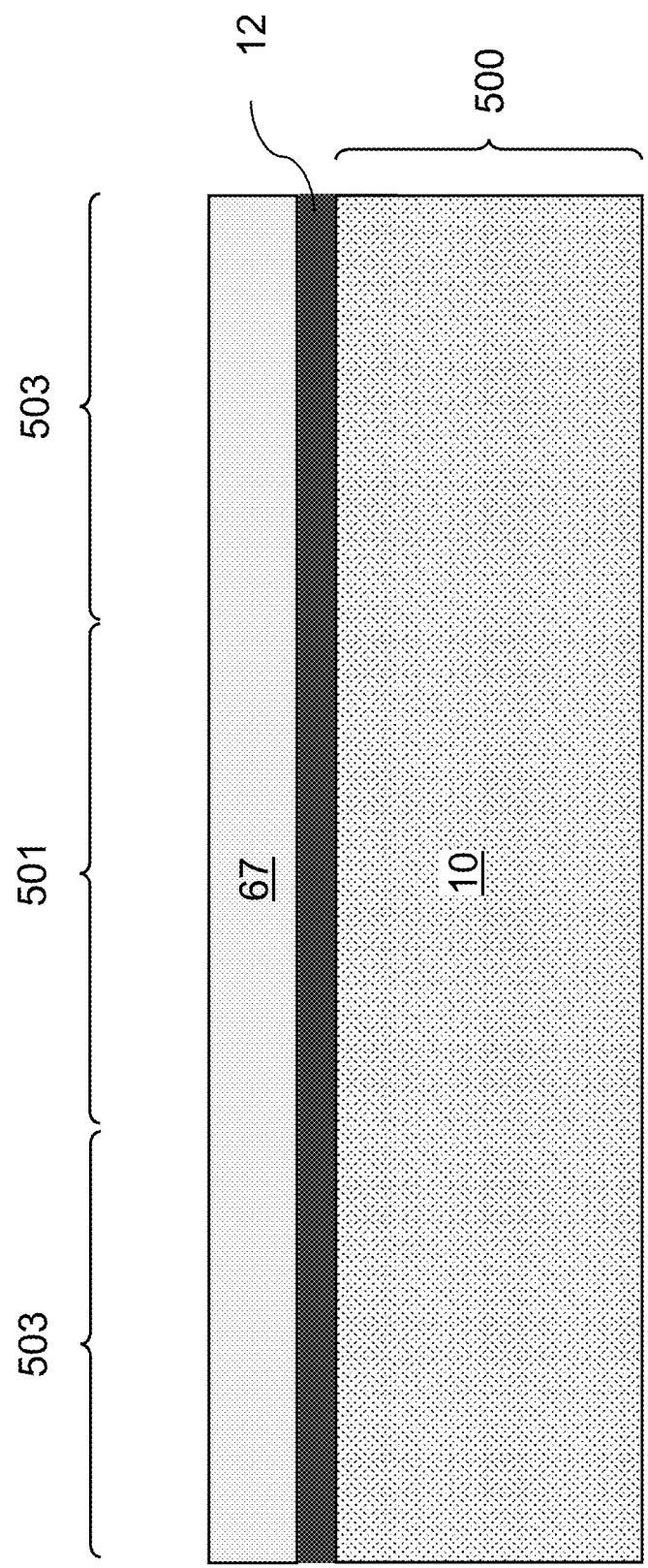

GERMANIUM-BASED PHOTODETECTOR WITH REDUCED DARK CURRENT

BACKGROUND

Image sensors capable of sensing images in infrared light, especially near- and short-wave infrared light, have a wide variety of applications including optical communications (both fiber and free space), range finding and depth mapping (e.g., Time-of-Flight (ToF), LADAR and LIDAR systems), non-destructive testing and inspection, ice detection (as on roads and aircraft), and pharmaceutical manufacturing.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 is a vertical cross-sectional view of an exemplary intermediate structure during formation of an image sensor that includes at least one germanium-based detection region that is formed in a recess in a semiconductor material substrate, according to various embodiments of the present disclosure.

FIG. 2 is a vertical cross-sectional view of an exemplary intermediate structure during formation of an image sensor after the formation of a hard mask layer.

FIG. 3 is a vertical cross-sectional view of an exemplary intermediate structure during formation of an image sensor after the formation of a photoresist layer over the hard mask layer.

DETAILED DESCRIPTION

Figure 4:
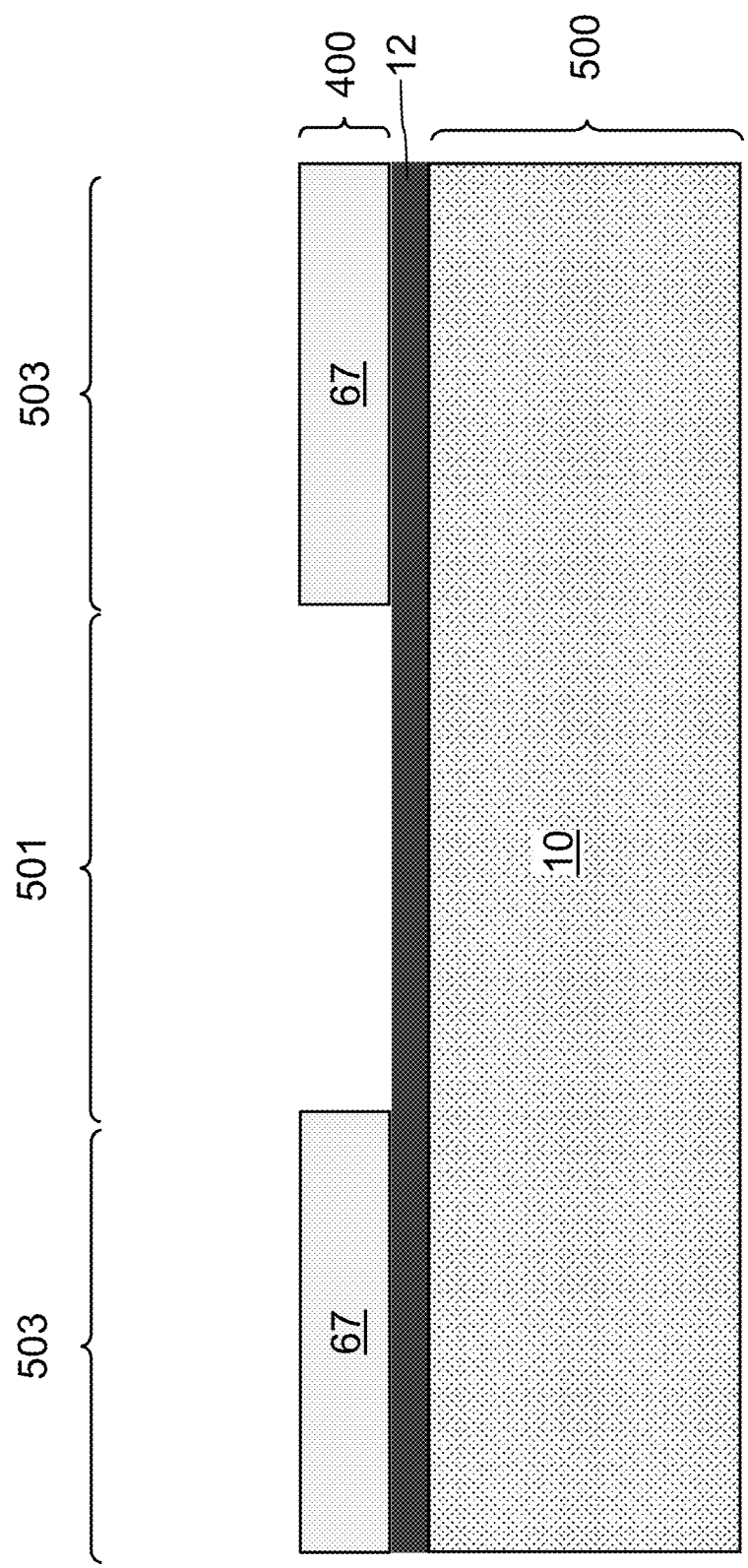
FIG. 4 is a vertical cross-sectional view of an exemplary intermediate structure during formation of an image sensor after the patterning of the photoresist layer over the hard mask layer.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Generally, the structures and methods of the present disclosure may be used to manufacture a germanium-based photodetector and/or an image sensor incorporating array of germanium-based photodetectors. Specifically, the structures and methods of the present disclosure may be used to manufacture a germanium-based photodetector formed on a silicon substrate, i.e., a germanium-in-silicon (GiS) photodetector and/or an image sensor including an array of GiS photodetectors. Such a photodetector or an image sensor may provide high quantum efficiency at near-infrared (NIR) spectrum for various sensing applications, including for example, as an image sensor for a Time-of-Flight (ToF) detection system.

A time-of-flight (ToF) detection system uses a light source and an image sensor to determine distances between the camera and one or more objects within the field-of-view of the image sensor. A ToF detection system may operate by illuminating a scene using artificial light from an illumination unit, and detecting light that is reflected off of one or more objects in the scene and received at the image sensor. The ToF detection system may calculate the distance between the image sensor and various points within the scene using image data collected by the image sensor. To calculate distance information, the system may utilize a direct time-of-flight technique in which the system directly measures the time it takes for light to leave the illumination unit and reflect back to each pixel of the image sensor. This may enable depth information for a full 3D scene to be captured with a single light pulse.

Alternatively, a ToF detection system may utilize an indirect time-of-flight measurement technique, such as a phase detection technique in which the light emitted from the illumination source is modulated by a periodic reference signal, and the image sensor may detect the phase shift of the reference signal in the reflected light to determine distance information.

Unlike scanning range imaging systems, such as LIDAR, a ToF detection system is able to extract depth information from a scene in a single shot. ToF systems can also operate at relatively high frequencies, making them well-suited for real-time range finding and depth mapping applications.

ToF detection systems typically utilize infrared (IR) light, which may be less sensitive to interference from ambient light in the visible range. Additionally, because IR light is invisible to the human eye, the use of IR light may make the ToF detection system unobtrusive to humans. The use of IR light may affect the types of image sensors used in a ToF system. For example, the photodetectors of the image sensor may be made from a semiconductor material having a relatively high quantum efficiency for IR radiation. Germanium-based photodetectors have been used for IR radiation detection due to their high-quantum efficiency in the IR spectra compared to other candidate materials, such as silicon.

Germanium-based photodetectors are frequently formed on or within a substrate made of a different semiconductor material, such as silicon. This may enable image sensors having germanium-based photodetectors to be made using lower-cost, well-established fabrication techniques commonly used for manufacture of silicon-based semiconductor devices. Conventional germanium-based photodetectors have relied upon germanium layer(s) formed over a semiconductor substrate. However, such a configuration may limit the number of germanium layers that may be integrated into a device, which may reduce device resolution and/or increase device size and complexity. An alternative technique that may address some of these issues is to embed the germanium-based detection region directly into the semiconductor substrate.

However, differences in lattice constant between the germanium-based material of the photodetectors and the semiconductor material of the substrate in which the germanium-based material is embedded can result in defects in the crystal structure of the germanium material, such as slips. These slips can propagate into the germanium material of the photodetector and can increase the potential for dark current in the photodetector. Dark current may be defined as the existence of current in the photodetector when no actual illumination is present. In other words, the dark current is the current that flows through the photodiode despite no photons entering the photodiode. Excessive dark current can reduce the accuracy of the image sensor.

In order to address the issue of dark current and improve performance of an image sensor having a germanium-based photodetector, such as an image sensor for a Time-of-Flight (ToF) system, various embodiments disclosed herein include a photodetector having a germanium-based well embedded in a semiconductor material layer of a substrate, where a gap surrounds the lateral side surface of the germanium-based well. In embodiments, the germanium-based well may include a germanium-containing material that includes germanium at an atomic percentage greater than 50%, and the semiconductor material layer of the substrate includes second semiconductor material that includes germanium at an atomic percentage between 0% and 50%. In various embodiments, the second semiconductor material layer may be a silicon-containing material that includes silicon at an atomic percentage greater than 50%. The germanium-based well may contact the second semiconductor material on a bottom surface of the germanium-based well, but may be removed from (i.e., may not contact) the second semiconductor material around the lateral side surfaces of the germanium based well. The gap surrounding the lateral side surface of the germanium-based well may reduce the surface contact area between the germanium-containing material of the germanium-based well and the surrounding second semiconductor material, which may be a silicon-based material. This may help minimize the formation of crystal defects, such as slips, in the germanium-based well, and thus may reduce the dark current in the photodetector and improve device performance.

FIGS. 1-13 are sequential vertical cross-sectional views of an exemplary structure during formation of an image sensor that includes at least one germanium-based detection region that is formed in a recess in a semiconductor material substrate, according to various embodiments of the present disclosure. Referring to FIG. 1, the exemplary structure includes a substrate 500 that includes a semiconductor material layer 10. The substrate 500 may include a first major horizontal surface located on a front side 7 of the substrate 500, and a second major surface located on a back side 17 of the substrate 500. The substrate 500 may include a bulk semiconductor substrate, which the semiconductor material layer 10 may continuously extend from the front side 7 to the back side 17 of the substrate 500 as shown in FIG. 1. In other embodiments, the substrate 500 may have a semiconductor-on-insulator structure in which the semiconductor material layer 10 is located over a buried insulator layer of the substrate 500.

In the embodiment of FIG. 1, the semiconductor material layer 10 may include a semiconductor material that includes germanium at an atomic percentage between 0% and 50%. In various embodiments, the semiconductor material layer 10 may be a silicon-based semiconductor material, and may be a single crystalline silicon material. Other suitable silicon-based semiconductor materials are within the contemplated scope of disclosure, such as polycrystalline silicon, amorphous silicon, and/or a compound or alloy of silicon and one or more other elements. In various embodiments, the semiconductor material layer 10 may include a silicon-germanium alloy in which the atomic percentage of silicon is greater than 50% and the atomic percentage of germanium is less than 50%.

The semiconductor material layer 10 may have a doping of a suitable conductivity type, which may be p-type or n-type. In one embodiment, the semiconductor material layer 10 may have a doping of a first conductivity type, and may include dopants of the first conductivity type at an atomic concentration in a range from $1.0 \times 10^{13}/cm^3$ to $1.0 \times 10^{17}/cm^3$, although lesser and greater dopant concentrations may also be used.

The exemplary structure may include a first region 501 in which a germanium-based detection region of an image sensor may be subsequently formed. The first region 501 may be laterally surrounded by a second region 503 of the exemplary structure. Although a single first region 501 is illustrated in FIG. 1, it will be understood that the exemplary structure may include a plurality of first regions 501 laterally separated from each another by a second region 503 of the exemplary structure. The first regions 501 may form an array pattern on the exemplary structure.

Referring to FIG. 2, a hard mask layer 12 may be formed over the semiconductor material layer 10. The hard mask layer 12 may include a dielectric material such as silicon oxide. Other suitable dielectric materials are within the contemplated scope of disclosure. The hard mask layer 12 may be formed by deposition of a silicon oxide layer using a suitable deposition method, or by thermal oxidation of a surface portion of the semiconductor material layer 10. As used herein, a "suitable deposition method" may include, for example, a chemical vapor deposition (CVD) process, a physical vapor deposition (PVD) process, an atomic layer deposition (ALD) process, a high-density plasma CVD (HDPCVD) process, a metalorganic CVD (MOCVD) process, a plasma enhanced CVD (PECVD) process, a sputtering process, laser ablation, or the like. The thickness of the hard mask layer 12 may be in a range from 50 nm to 300 nm, such as from 80 nm to 150 nm, although lesser and greater thicknesses may also be used.

Referring to FIG. 3, a photoresist layer 67 may be applied over the hard mask layer 12. Referring to FIG. 4, the photoresist layer 67 may be lithographically patterned to form an etch mask 400. The photoresist layer 67 may include photosensitive material that may be altered when exposed to certain types of radiation. For example, the photoresist material may be positive photoresist material, in which exposure to ultraviolet (UV) radiation makes polymers contained in the photoresist material more soluble and easier to remove, or negative photoresist material, in which exposure to UV radiation makes the polymers crosslink and harder to remove. The photoresist layer 67 may be exposed to radiation (e.g., ultraviolet (UV) light) through a photolithography mask to transfer the mask pattern to the photoresist layer. The undesired photoresist material may then be removed to form the etch mask 400.

Referring again to FIG. 4, the etch mask 400 may include an opening that exposes the upper surface of the hard mask layer 12 in the first region 501 of the exemplary structure. The etch mask 400 may cover the upper surface of the hard mask layer 12 in the second region 503 of the exemplary structure. The opening through the etch mask 400 in the first region 501 may have any suitable horizontal cross-sectional shape, such as a polygonal shape (e.g., a rectangular shape), a circular or elliptical shape, or an irregular shape. Although a single opening through the etch mask 400 is illustrated in FIG. 4, it will be understood that the etch mask 400 may include a plurality of openings exposing multiple discrete regions of the hard mask layer 12. The openings through the etch mask 400 may form an array pattern on the upper surface of the hard mask layer 12. Each opening through the etch mask 400 may correspond to a first region 501 of the exemplary structure within which a germanium-based detection region of an image sensor may be subsequently formed. The exemplary structure may include a plurality of first regions 501 laterally separated from each another by a second region 503 of the exemplary structure.

Figure 5:
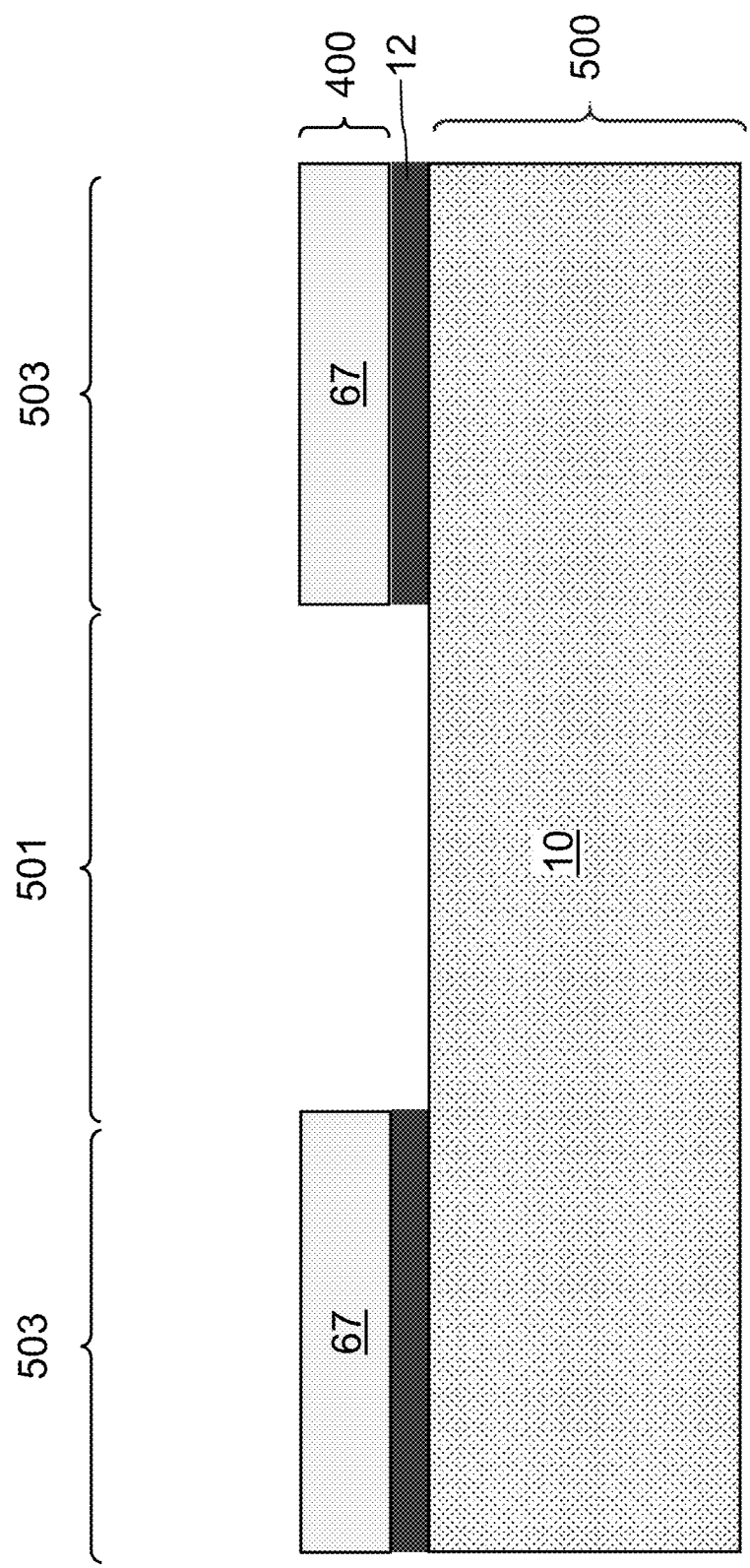
FIG. 5 is a vertical cross-sectional view of an exemplary intermediate structure during formation of an image sensor after the etching of the hard mask layer.

Referring to FIG. 5, the hard mask layer 12 may be etched through the opening in the etch mask 400 to remove the hard mask layer 12 and expose the upper surface of the semiconductor material layer 10 in the first region 501 of the exemplary structure. The etch mask 400 may prevent the hard mask layer 12 from being etched in the second region 503 of the exemplary structure. The hard mask layer 12 may be etched using any suitable etching process, including a wet etching process or a dry etching process. The exposed portion of the upper surface of the semiconductor material layer 10 in the first region 501 may have a size and shape that corresponds to the size and shape of the opening through the etch mask 400. Following the etching of the hard mask layer 12, the photoresist material 67 of the etch mask 400 may be removed via a suitable process, such as ashing.

Figure 6:
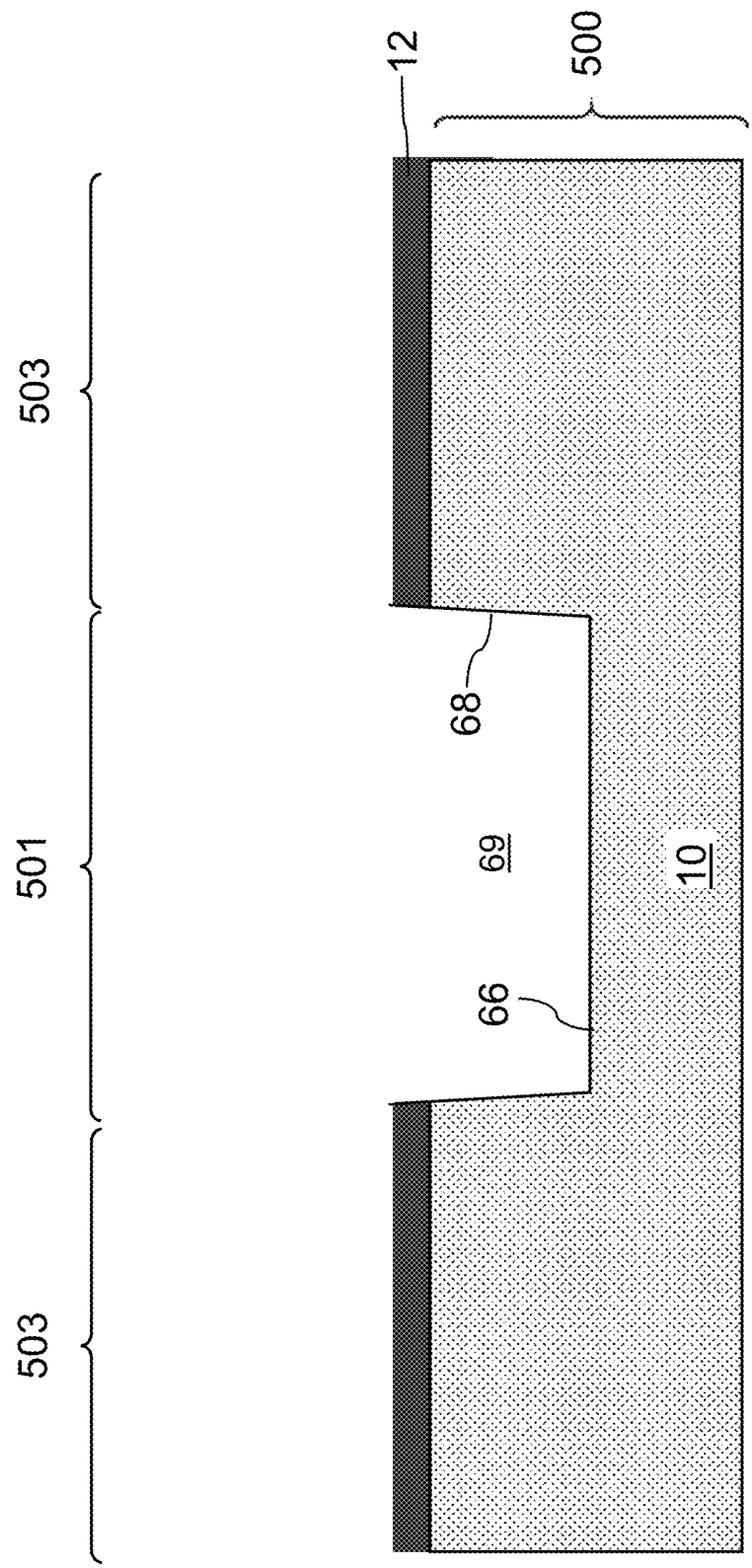
FIG. 6 is a vertical cross-sectional view of an exemplary intermediate structure during formation of an image sensor after the formation of a trench in the semiconductor material.

Referring to FIG. 6, the exposed upper surface of the semiconductor device layer 10 may be etched to remove portions of the semiconductor device layer 10 and form a trench 69 in the first region 501 of the exemplary structure. The hard mask layer 12 may prevent the semiconductor device layer 10 from being etched in the second region 503 of the exemplary structure. The semiconductor device layer 10 may be etched using an anisotropic etch process. In embodiments, the semiconductor device layer 10 may be etched using an anisotropic dry etching process, such as a reactive ion etching process.

In one embodiment, the depth of the trench 69 formed in the first region 501 may be in a range from 0.5 micron to 10 microns, such as from 1 micron to 6 microns, although lesser and greater depths may also be used. The lateral dimension of the trench 69 may be in a range from 0.5 micron to 30 microns, such as from 1 micron to 15 microns, although lesser and greater lateral dimensions may also be used. The lateral dimension of the trench 69 may be the diameter or the major axis of the horizontal cross-sectional shape of the trench 69 in embodiments in which the trench 69 has a circular or an elliptical horizontal cross-sectional shape, or may be the length of a side of a rectangular shape in embodiments in which the horizontal cross-sectional shape of the trench 69 is a rectangular shape. The trench 69 may include a horizontally-extending bottom surface 66 and at least one vertically-extending sidewall 68. In embodiments in which the horizontal cross-sectional shape of the trench 69 is a rectangular shape, the trench 69 may include four vertically-extending sidewalls 68.

Although a single trench 69 is shown in FIG. 6, it will be understood that a plurality of trenches 69 may be formed in the semiconductor material layer 10 of the exemplary structure. The plurality of trenches 69 may be in an array pattern.

In an alternative embodiment, the hard mask layer 12 and portions of the semiconductor material layer 10 in the first region 501 may be removed during the same etching process. The hard mask layer 12 may be etched through the opening in the etch mask 400 to remove the hard mask layer 12 and expose the upper surface of the semiconductor material layer 10 in region 501, and the semiconductor material layer 10 may also be etched through the opening in the etch mask 400 to remove portions of the semiconductor material layer 10 and form a trench 69 in region 501. The etching process may be an anisotropic dry etching process, such as a reactive ion etching process.

Figure 7:
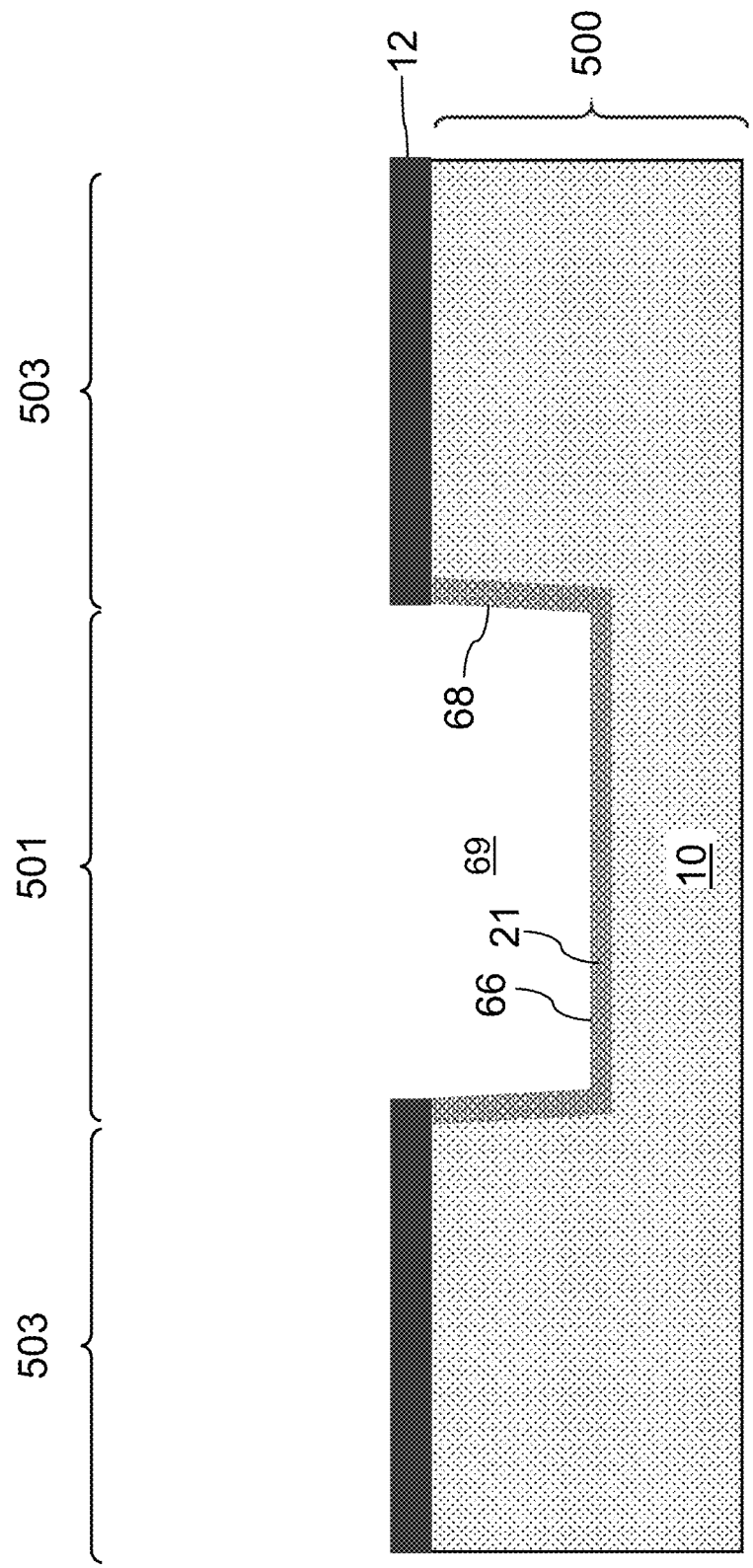
FIG. 7 is a vertical cross-sectional view of an exemplary intermediate structure during formation of an image sensor after an implantation process.

Referring to FIG. 7, dopants of the first conductivity type may be implanted into the semiconductor material layer 10 around the region of the trench 69 in the first region 501. A multiple angled ion implantation processes may be performed to implant the dopants of the first conductivity type into the semiconductor material layer 10 through sidewalls 68 of the trench 69. In addition, the dopants of the first conductivity type may be implanted into a horizontal portion of the semiconductor material layer 10 that underlies the bottom surface 66 of the trench 69. In embodiments, the dopants of the first conductivity type may include boron. However, the present disclosure is not limited thereto, and other dopant species may be encompassed by the present disclosure. A first-conductivity-type semiconductor material region 21 may be formed within the semiconductor material layer 10 in the first region 501. The lateral width of the first-conductivity-type semiconductor material region 21 around each sidewall 68 of the trench 69 may be in a range from 100 nm to 1,000 nm, although lesser and greater lateral dimensions may also be used. The thickness of the horizontal portion of the first-conductivity-type semiconductor material region 21 underneath the bottom surface 66 of the trench 69 may be in a range from 100 nm to 1,000 nm, although lesser and greater thicknesses may also be used.

Optionally, a thin semiconductor material liner (not illustrated) may be grown from physically exposed surfaces of the first-conductivity-type semiconductor material region 21, which are surfaces of the trench 69. The semiconductor material liner, if present, may function as a buffer between a germanium-based material to be subsequently deposited in the trench 69 and the first-conductivity-type semiconductor material region 21. The semiconductor material liner may be grown by a selective epitaxy process that grows epitaxial semiconductor material, such as epitaxial silicon, only from physically exposed semiconductor surfaces and does not grow semiconductor material from dielectric surfaces. The semiconductor material liner may include epitaxially grown silicon, i.e., single crystalline silicon in epitaxial alignment with single crystalline silicon material of the semiconductor material layer 10. The semiconductor material liner may be intrinsic, or may have a low level of doping. The thickness of the semiconductor material liner may be in a range from 5 nm to 200 nm, such as from 10 nm to 100 nm, although lesser and greater thicknesses may also be used.

Figure 8:
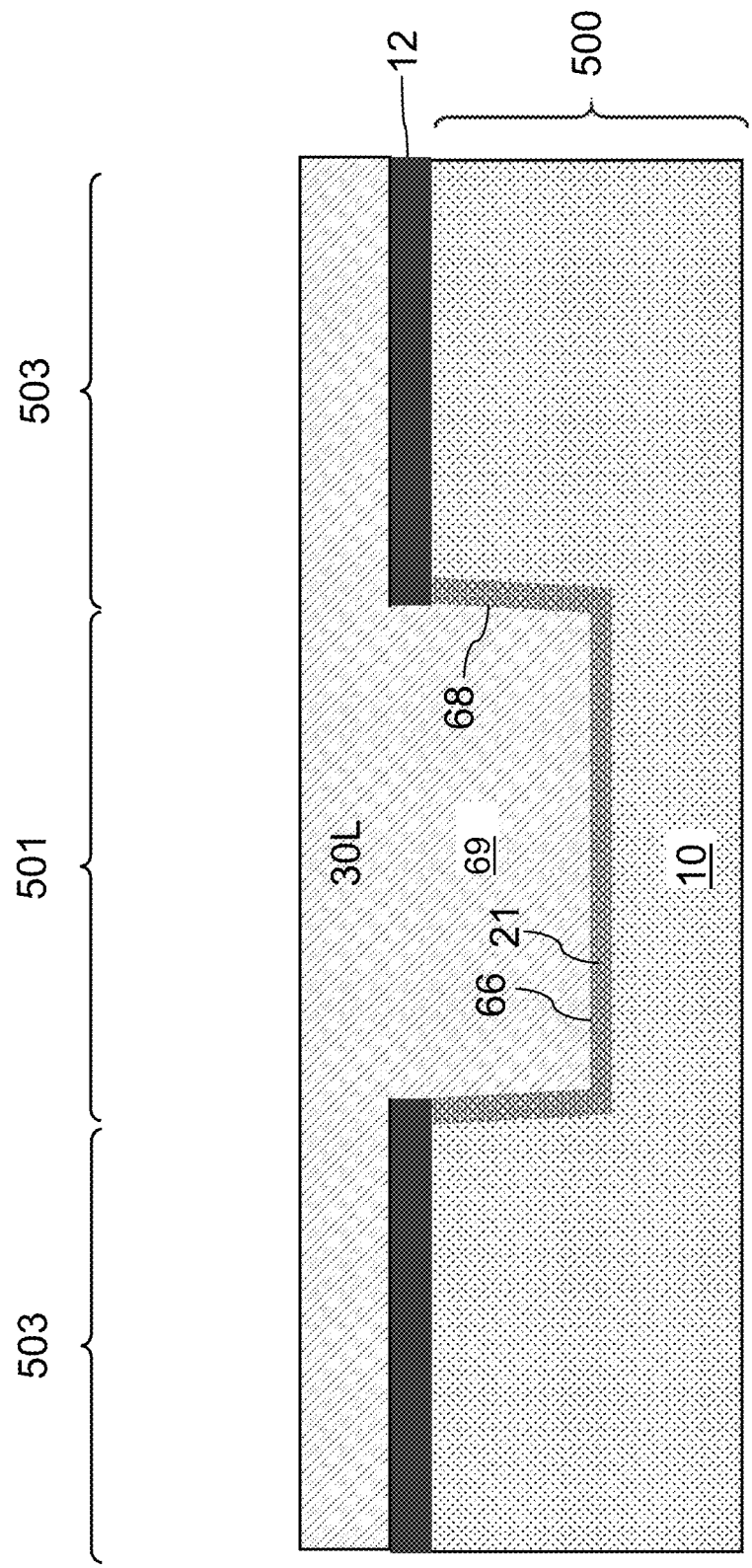
FIG. 8 is a vertical cross-sectional view of an exemplary intermediate structure during formation of an image sensor after the formation of a germanium-based material in the trench and over the hard mask.

Referring to FIG. 8, a germanium-based material may be grown from the physically exposed surfaces of the trench 69, which may be the physically exposed surfaces of the first-conductivity-type semiconductor material region 21, or in embodiments in which a semiconductor material liner is present, from the physically exposed surfaces of the semiconductor material liner. The germanium-based material includes germanium at an atomic percentage greater than 50%. In one embodiment, the germanium-containing material may include doped or undoped germanium such that the atomic percentage of germanium is at least 99%, and is essentially free of silicon or other elements. In another embodiment, the germanium-containing material may include a silicon-germanium alloy in which the atomic percentage of germanium is greater than 50%, and the atomic percentage of silicon is less than 50%. A germanium-containing material layer 30L may be formed by the deposited germanium-based material.

The germanium-containing material layer 30L may be formed by a selective deposition process or a non-selective deposition process. A selective deposition process is a process in which the germanium-containing material is grown from physically exposed semiconductor surfaces such as the physically exposed surfaces of the first-conductivity-type semiconductor material region 21, or optionally the physically exposed surfaces of a semiconductor material liner (if present), on the sidewalls 68 and bottom surface 66 of the trench 69. In this embodiment, a germanium-containing reactant (such as germane or digermane) may be flowed into a process chamber containing the exemplary structure concurrently with, or alternately with, flow of an etchant gas such as hydrogen chloride. Generally, a semiconductor material (such as a germanium-containing material) has a higher growth rate on semiconductor surfaces than on dielectric surfaces. The flow rates and the deposition temperature may be controlled such that the net deposition rate (i.e., the deposition rate less the etch rate) is positive on semiconductor surfaces, and is negative on dielectric surfaces during the selective deposition process. In this embodiment, growth of the germanium-containing material occurs only on semiconductor surfaces. A non-selective deposition process is a deposition process in which the germanium-containing material grows from all physically exposed surfaces. In this embodiment, the deposition process may use a germanium-containing reactant without use of an etchant gas.

In one embodiment, the selective deposition process or the non-selective deposition process that may be used to deposit the germanium-containing material layer 30L may be an epitaxial deposition process, i.e., a deposition process that provides alignment of crystallographic structure of the deposited germanium-containing material to the crystalline structure at the physically exposed surfaces of the underlying material portions. Thus, the portion of the germanium-containing material layer 30L that may be deposited in the trench 69 may be epitaxially aligned to the crystalline structure of the first-conductivity-type semiconductor material region 21, or, if present, the semiconductor material liner. In embodiments in which a selective epitaxial deposition process is used to deposit the germanium-containing material layer 30L, the material of the germanium-containing material layer 30L may grow from the physically exposed surfaces of the first-conductivity-type semiconductor material region 21, or, if present, the semiconductor material liner. In such embodiments, the entirety of the germanium-containing material layer 30L may be single crystalline and may be in epitaxial alignment with the single crystalline semiconductor material of the single crystalline semiconductor material layer 10.

In embodiments in which a non-selective epitaxial deposition process is used to deposit the germanium-containing material layer 30L, the material of the germanium-containing material layer 30L grows from the physically exposed surfaces of the first-conductivity-type semiconductor material region 21 (or from the semiconductor material liner, if present), and from the physically exposed surfaces of the hard mask layer 12. In this embodiment, only the portion of the germanium-containing material layer 30L that grows from the physically exposed surfaces of the first-conductivity-type semiconductor material region 21 (or from the semiconductor material liner, if present) may be single crystalline, and the portions of the germanium-containing material layer 30L that grows from the physically exposed surfaces of the hard mask layer 12 may be polycrystalline.

Generally, an epitaxial deposition process may be performed to grow a single crystalline germanium-containing material inside the trench 69. At least the portion of the germanium-containing material layer 30L that grows within the trench 69 may be single crystalline, and may be formed with epitaxial alignment with the single crystalline material of the single crystalline semiconductor material substrate 10. In this embodiment, the entirety of the portion of the germanium-containing material layer 30L located within the trench 69 may be single crystalline.

The germanium-containing material layer 30L may be intrinsic, or may have a low level of doping. For example, the atomic concentration of dopants within the germanium-containing material layer 30L may be in a range from $1.0 \times 10^{13}/cm^3$ to $1.0 \times 10^{18}/cm^3$, although lesser and greater dopant concentrations may also be used.

Due to thermal effects, the composition of the material near the interface between the germanium-containing material layer 30L and the surrounding second semiconductor material along the bottom surface 66 and sidewall 68 of the trench 69 may include a mixture of the germanium-containing material of the germanium-containing material layer 30L and the second semiconductor material. For example, in embodiments in which the germanium-containing material layer 30L is germanium and the second semiconductor material is silicon, the composition of the material on either side of the interface may include a mixture of germanium and silicon (e.g., $Si_xGe_{1-x}$, X range 1~0), where the relative concentrations of the materials may be dependent on the temperature and process time used in forming the germanium-containing material layer 30L. In various embodiments, the region around the interface between the germanium-containing material layer 30L and the surrounding second semiconductor material that includes a mixture of the germanium-containing material of the germanium-containing material layer 30L and the second semiconductor material may have a thickness of about 0.5 μm or less.

Figure 9:
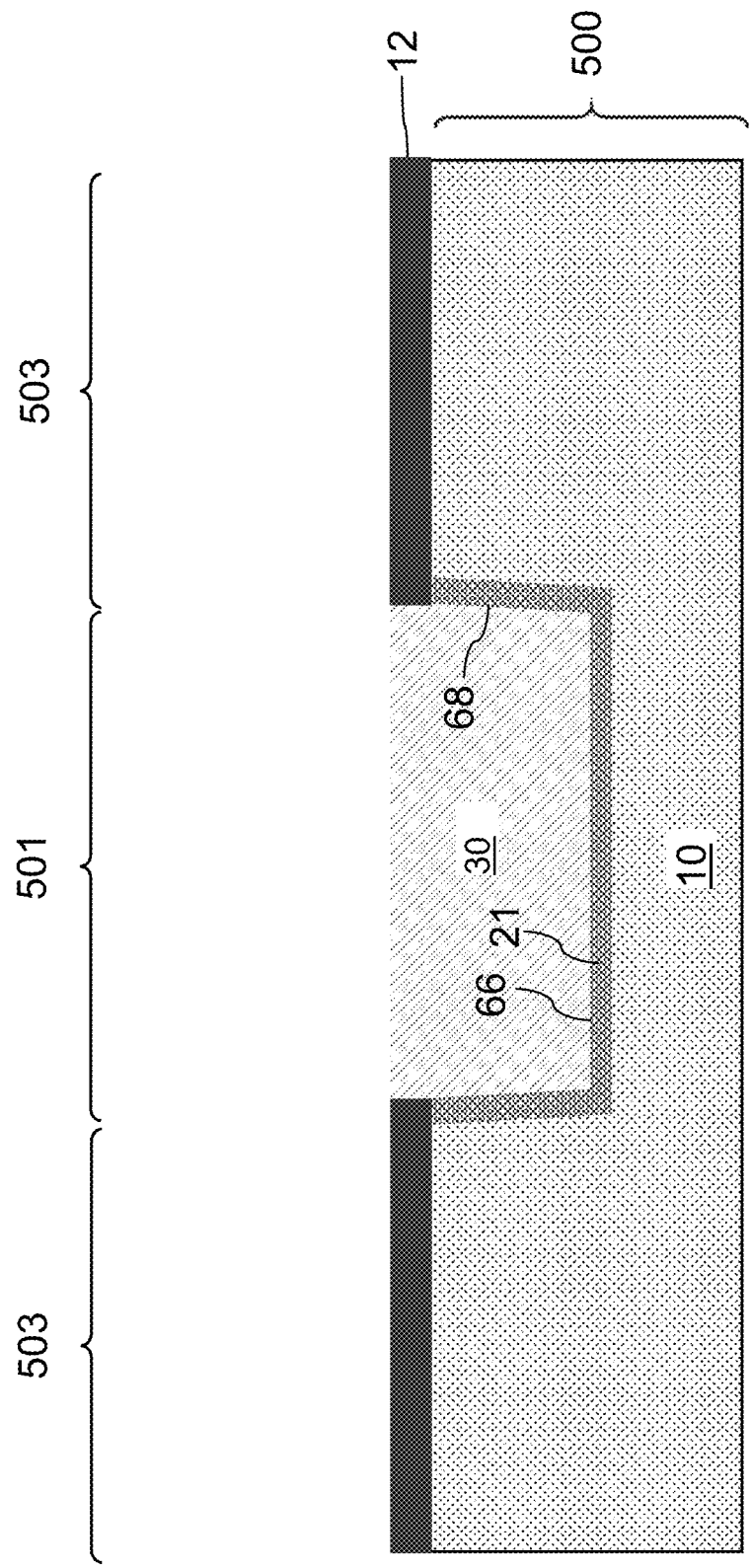
FIG. 9 is a vertical cross-sectional view of an exemplary intermediate structure during formation of an image sensor after a planarization process.

Referring to FIG. 9, excess portions of the germanium-containing material may be removed from above the horizontal plane including the top surface of the hard mask layer 12. In one embodiment, a chemical mechanical planarization (CMP) process may be performed to remove portions of the germanium-containing material layer 30L located above the horizontal plane including the top surface of the hard mask layer 12. A remaining portion of the germanium-containing material layer 30L located within the trench 69 comprises a germanium-containing material portion, which is herein referred to as a germanium-based well 30. The germanium-based well 30 may have a top surface within the same horizontal plane (i.e., co-planar) as the top surface of the hard mask layer 12.

While the present disclosure is described using an embodiment in which the germanium-based well 30 is formed as a single crystalline germanium-containing material portion, the germanium-based well 30 may be formed as a polycrystalline material portion or as an amorphous material portion albeit at a reduced efficiency. Such variations are expressly contemplated herein.

Figure 10:
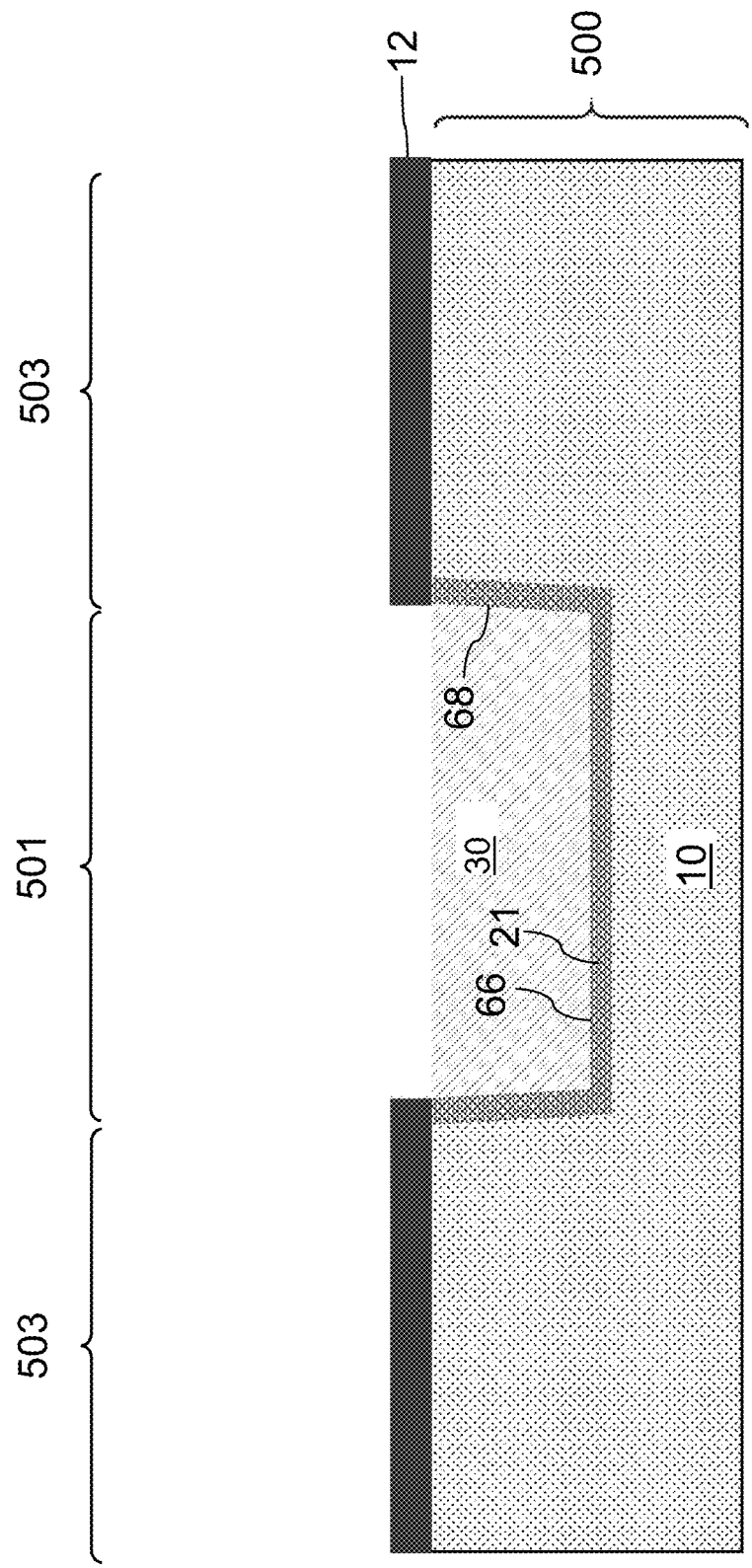
FIG. 10 is a vertical cross-sectional view of an exemplary intermediate structure during formation of an image sensor after vertically recessing portions of the germanium based material formed in the trench to form a germanium-based well.

Referring to FIG. 10, a remaining portion of the germanium-containing material may be vertically recessed within an opening in the hard mask layer 12. Specifically, the germanium-based well 30 may be vertically recessed, for example, by performing a recess etch process. In such embodiments, the vertical recess distance may be greater than, the same as, or less than, the thickness of the hard mask layer 12. Regardless of the vertical recess distance, the germanium-based well 30 does not contact the hard mask layer 12, and the material of the germanium-based well 30 does not contact any oxygen-containing material (such as silicon oxide) of the hard mask layer 12. In embodiments in which a semiconductor material liner is not used, the vertical recess distance may be greater than the thickness of the hard mask layer 12 to prevent direct contact between the germanium-based well 30 and the hard mask layer 12. In embodiments in which the semiconductor material liner is present, the semiconductor material liner may prevent direct contact between the germanium-based well 30 and the hard mask layer 12, and the vertical recess distance may be greater than, equal to, or less than the thickness of the hard mask layer 12.

Referring again to FIG. 10, the germanium-containing material of the germanium-based well 30 fills the trench 69 and contacts a second semiconductor material along the bottom surface 66 and the sidewall(s) 68 of the trench 69. The second semiconductor material may be the first-conductivity-type semiconductor material region 21, or, if present, a semiconductor material liner. In either case, the second semiconductor material may have a different composition than the composition of the germanium-containing material of the germanium-based well 30. As discussed above, the second semiconductor material may be a semiconductor material that includes germanium at an atomic percentage between 0% and 50%. In various embodiments, the second semiconductor material may be a silicon-based semiconductor material in which the atomic percentage of silicon is greater than 50%. The second semiconductor material may be a single crystalline silicon material. Dislocations in the crystalline structures at the interface between the germanium-containing material of the germanium-based well 30 and the surrounding second semiconductor material may result in slip defects which can propagate into the germanium-based well 30. These slip defects can induce dark current in the photodetector that is subsequently formed using the germanium-based well 30, and may negatively impact the performance of the photodetector.

In various embodiments of the present disclosure, a gap may be formed around the lateral side surfaces of the germanium-based well 30. The gap may reduce the surface contact area between the germanium-containing material of the germanium-based well 30 and the surrounding second semiconductor material, which may be a silicon-based material. This may help minimize the formation of slip defects in the germanium-based well 30, and may reduce the dark current in the photodetector that is subsequently formed.

Figure 11:
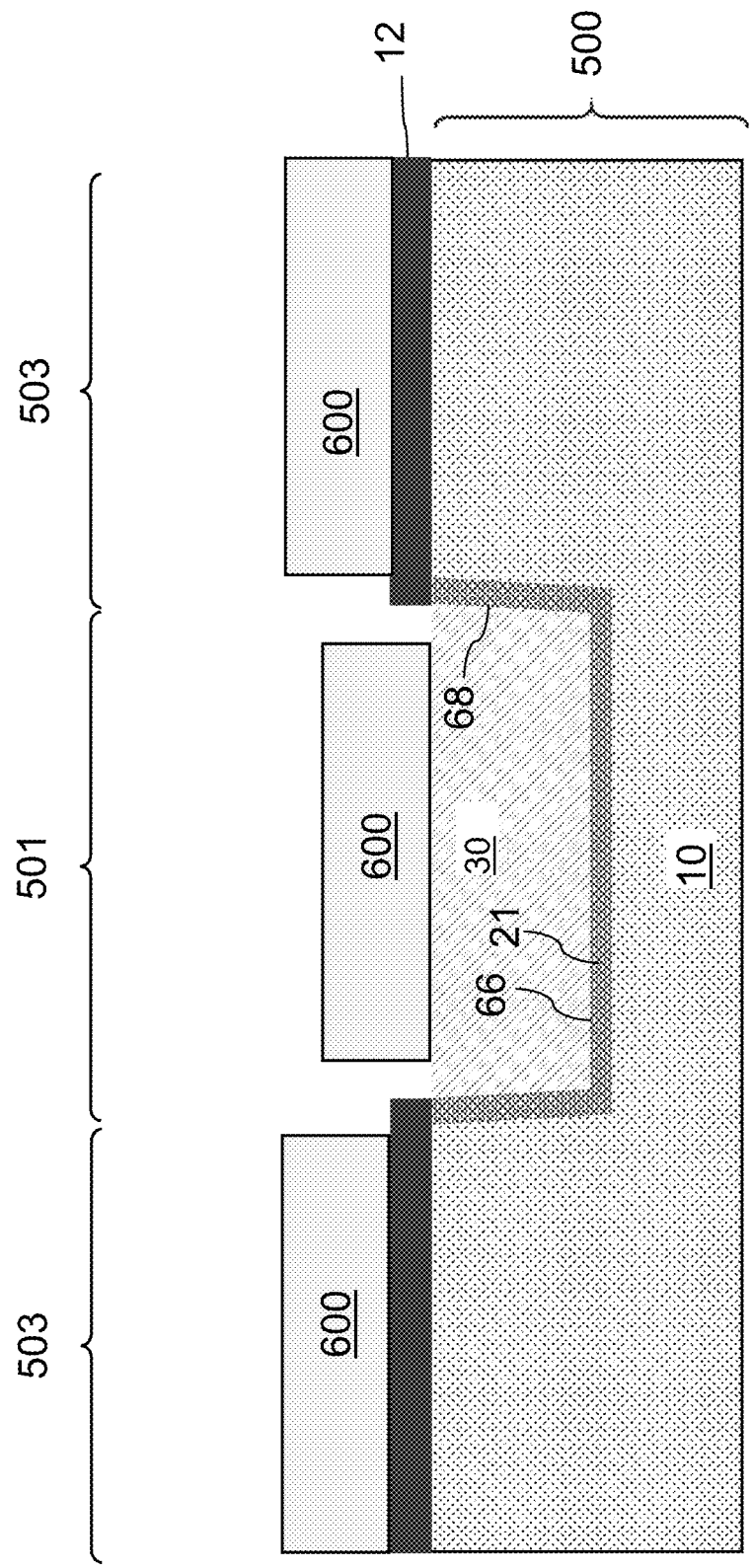
FIG. 11 is a vertical cross-sectional view of an exemplary intermediate structure during formation of an image sensor after the formation of a photoresist etch mask over the germanium-based well.

Referring to FIG. 11, a photoresist material may be applied over the hard mask layer 12 and the exposed top surface of the germanium-based well 30, and may be lithographically patterned to form an etch mask 600 as described above. The etch mask 600 may include an opening that exposes a peripheral portion of the germanium-based well 30 and overlies a lateral edge of the germanium-based well 30, where the germanium-based well contacts the sidewall 68 of the trench 69. The opening in the etch mask 600 may extend around the entire lateral edge of the germanium-based well 30. The opening in the etch mask 600 may additionally expose a portion of the hard mask layer 12 that surrounds the lateral edge of the germanium-based well 30. The opening through the etch mask 600 may have a width of at least 0.5 nm, and may have a width between 1 nm and 1000 nm. A central portion of the germanium-based well 30 may be covered by the etch mask 600.

Figure 12A:
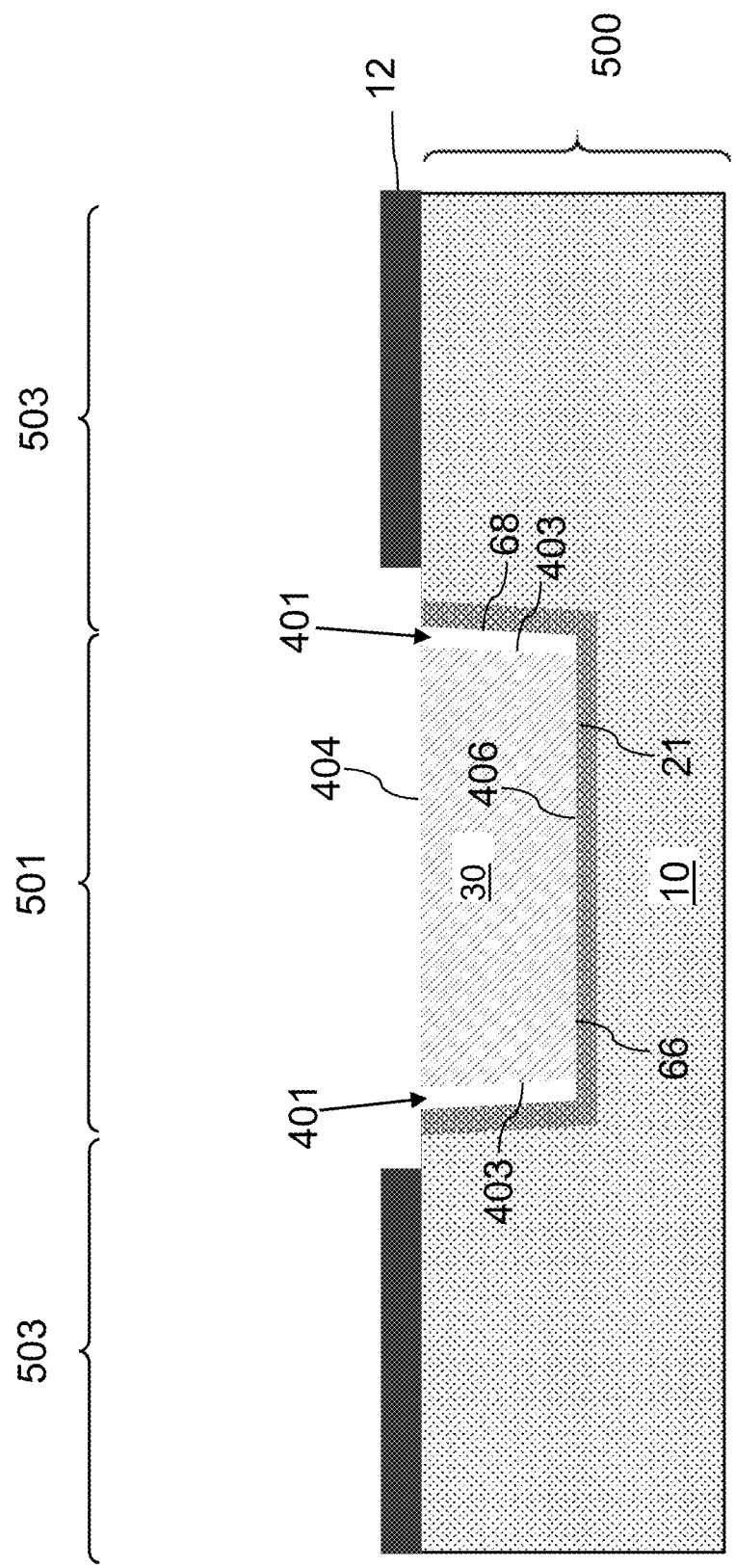
FIG. 12A is a vertical cross-sectional view of an exemplary intermediate structure during formation of an image sensor after etching a gap between the germanium based material formed in the trench and the doped sidewalls of the trench.

Referring to FIG. 12A, the peripheral portion of the germanium-based well 30 may be etched through the etch mask 600 to remove material around the lateral edge of the germanium-based well 30 and form a gap 401 surrounding the lateral side walls 403 of the germanium-based well 30. The germanium-based well 30 may be etched using an anisotropic etch process. In embodiments, the germanium-based well 30 may be etched using an anisotropic dry etching process, such as a reactive ion etching process. Following the etching process, the etch mask 600 may be removed via a suitable process, such as ashing.

The gap 401 formed around the lateral side walls of the germanium-based well 30 may have a width of 0.5 nm or more (e.g., 1 nm to 1000 nm). The etch process used to produce the gap 401 may also remove a portion of the hard mask layer 12 to expose a portion of the semiconductor material layer 10 surrounding the germanium-based well 30. Alternately, a portion of the hard mask layer 12 surrounding the germanium-based well 30 may be removed via a separate etching process.

Figure 12B:
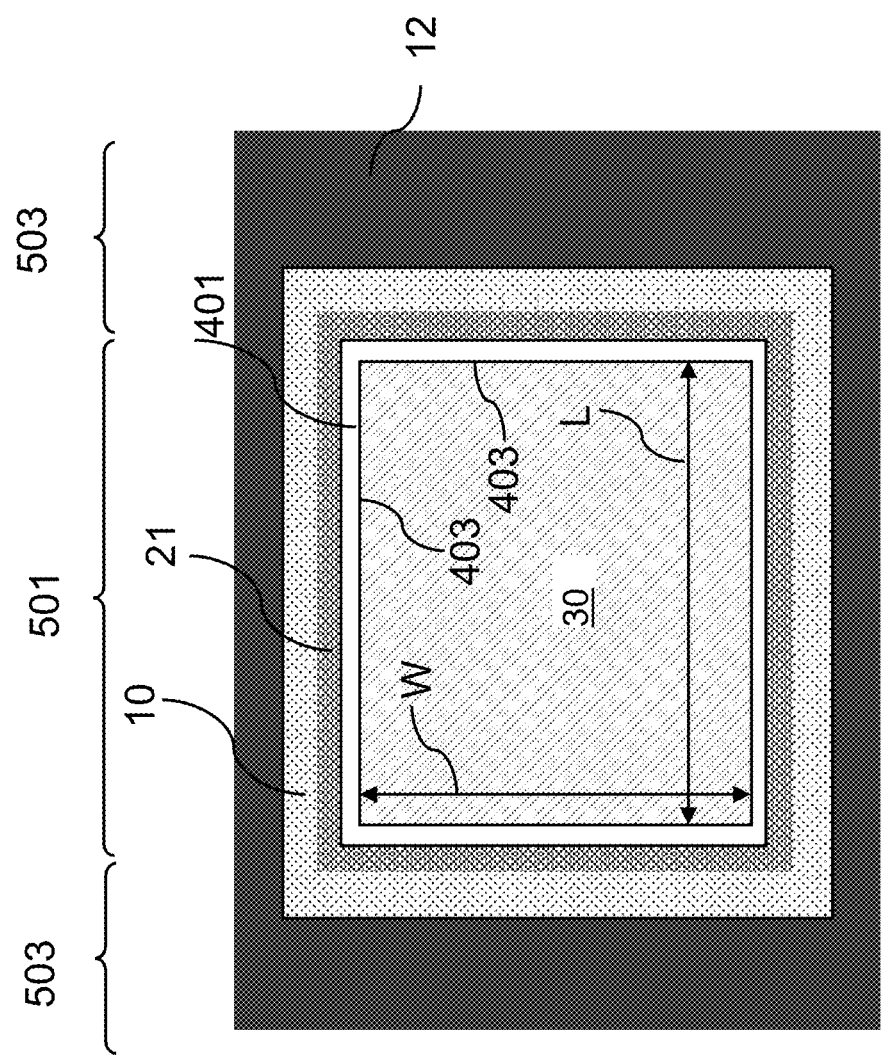
FIG. 12B is a top view of an exemplary intermediate structure during formation of an image sensor illustrating a germanium-based well having a cuboid shape in accordance with various embodiments.

The etching process may provide a germanium-based well 30 having a cuboid shape that includes a top surface 404, four lateral sidewalls 403, and a bottom surface 406 which contacts the second semiconductor material on the bottom surface 66 of the trench 69. FIG. 12B is a top view of the exemplary intermediate structure illustrating a germanium-based well 30 having a cuboid shape in accordance with various embodiments. The gap 401 may surround each of the lateral sidewalls 403 and may have a width that is at least 0.5 nm and is less than one-half of the sum of the length (L) and width (W) dimensions of the germanium-based well 30 along a horizontal cross-section of the well 30.

Figure 12C:
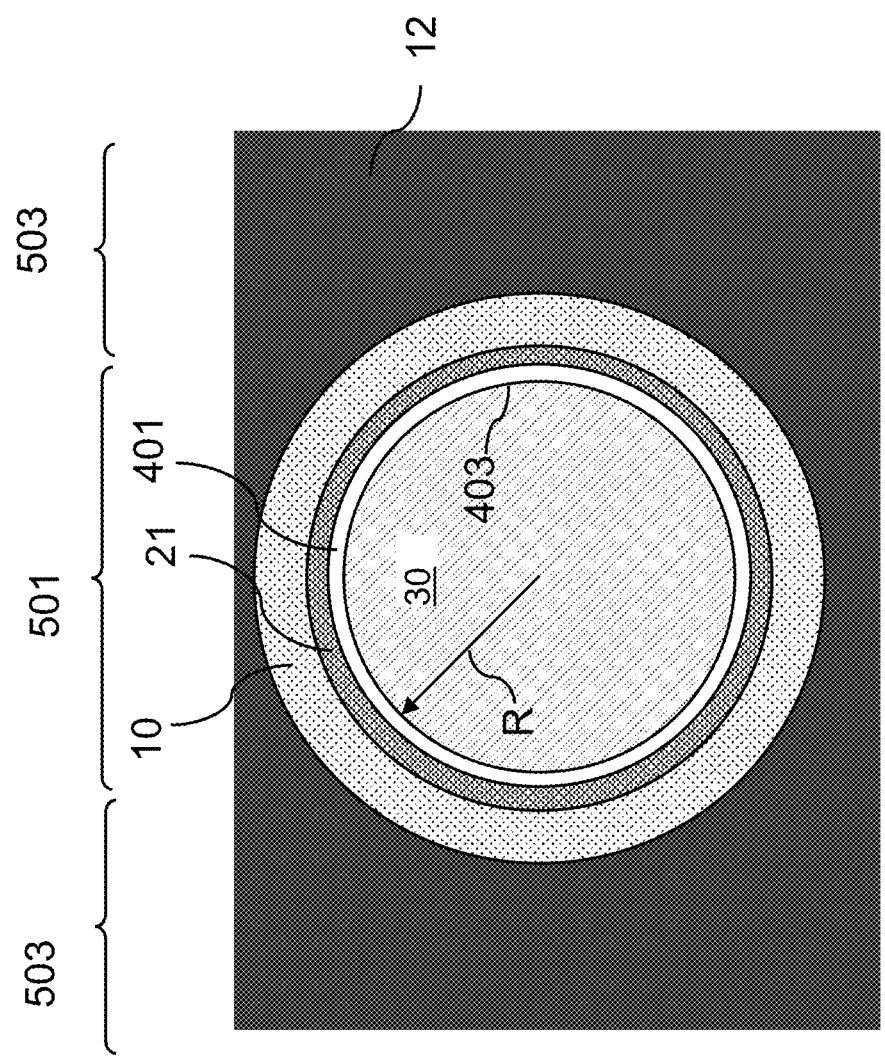
FIG. 12C is a top view of an exemplary intermediate structure during formation of an image sensor illustrating a germanium-based well having a cylindrical shape in accordance with various embodiments.

Alternately, the germanium-based well 30 may have a cylindrical shape that includes a top surface 404, a lateral sidewall 403 having a curved shape, and a bottom surface 406 which contacts the second semiconductor material on the bottom surface 66 of the trench 69. FIG. 12C is a top view of the exemplary intermediate structure illustrating a germanium-based well 30 having a cylindrical shape in accordance with various embodiments. The gap 401 may completely surround the lateral sidewall 403 having a curved shape. The gap 401 may have a width that is at least 0.5 nm and is less than a radius (R) of the cylindrically-shaped germanium-based well 30 along a horizontal cross-section of the well 30.

In some embodiments, the gap 401 may be filled with a dielectric material, such as an oxide material. Alternatively, the gap 401 may include an air gap between the sidewall 68 of the trench 69 and the lateral sidewall 403 of the germanium-based well 30.

Following the formation of the gap 401 (and in some embodiments the filled dielectric material), the germanium-based well 30 may only contact the second semiconductor material along the bottom horizontal surface of the trench 69. The gap 401 around the lateral side surface(s) of the germanium-based well 30 may minimize the formation of dislocations between the germanium-containing material of the germanium-based well 30 and the surrounding second semiconductor material, which may be a silicon-based material. This may reduce dark current in, and thereby improve the performance of, the photodetector that will be subsequently formed using the germanium-based well 30.

Figure 13:
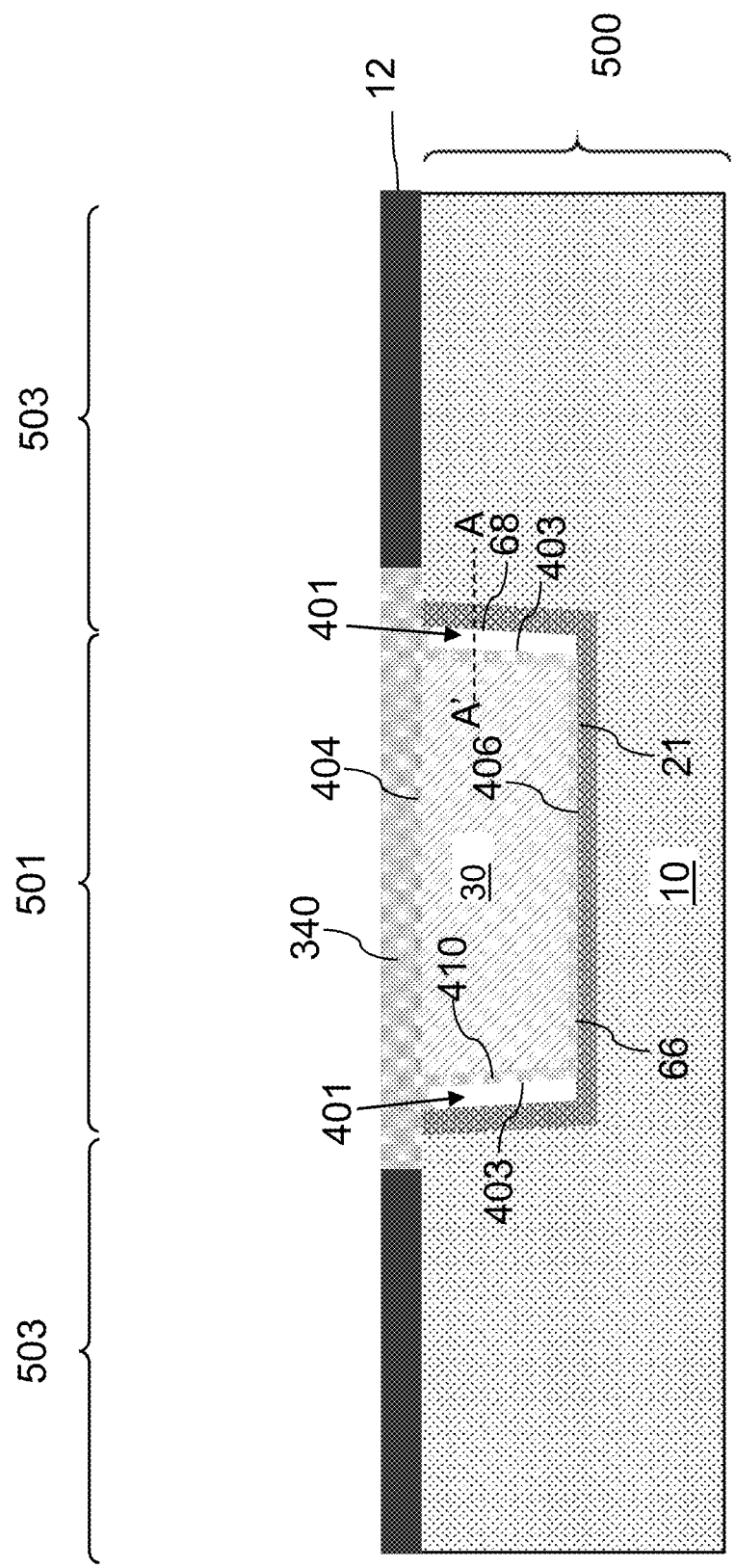
FIG. 13 is a vertical cross-sectional view of an exemplary intermediate structure during formation of an image sensor after deposition of a silicon containing capping material.

Referring to FIG. 13, a silicon-containing capping material may be deposited on the physically exposed top surface 404 of the germanium-based well 30. In embodiments, the silicon-containing capping material may also be deposited over the exposed horizontally-extending portion of the semiconductor material layer 10 surrounding the germanium-based well 30, including any exposed horizontally-extending portions of the first-conductivity-type semiconductor material region 21 and, if present, the silicon material liner. The silicon-containing capping material may also form over the top of the gap 401 surrounding the lateral sidewalls 403 of the germanium-based well 30, and at least partially over the lateral sidewalls 403 of the germanium-based well 30 and the sidewalls 68 of the trench 69, to provide a continuous passivation silicon region 340 extending over the top surface of the germanium-based well 30, the gap 401 surrounding the lateral side surfaces of the germanium-based well 30, and the exposed horizontally-extending portion of the semiconductor material layer 10 surrounding the germanium-based well 30. The top surface of the passivation silicon region 340 may be located within the same horizontal plane as the top surface of the hard mask layer 12.

The silicon-containing capping material of the passivation silicon region 340 may include, and/or may consist essentially of, a silicon-containing material that may prevent diffusion of oxygen. For example, the silicon-containing capping material may include, and/or may consist essentially of, silicon or silicon nitride. In one embodiment, a selective epitaxy process may be performed to grow silicon from the top surface of the germanium-based well 30. In this embodiment, a passivation silicon region 340 including single crystalline silicon may be formed over the germanium-based well 30. Alternatively, a selective or non-selective silicon deposition process may be performed under conditions that forms polycrystalline silicon. In this embodiment, the passivation silicon region 340 may include, and/or may consist essentially of, polysilicon.

If a selective silicon deposition process (which may, or may not, be an epitaxial deposition process) is used, the passivation silicon region 340 may be formed only inside the opening in the hard mask layer 12. In this embodiment, a planarization process is not necessary, and the top surface of the passivation silicon region 340 may be located at, below, or above, the horizontal plane including the top surface of the hard mask layer 12. If a non-selective silicon deposition process is used, a planarization process such as a chemical mechanical planarization process may be performed to remove portions of the deposited silicon material from above the horizontal plane including the top surface of the hard mask layer 12. In this embodiment, the top surface of the passivation silicon region 340 may be located within the same horizontal plane as the top surface of the hard mask layer 12.

In some embodiments, following the formation of the gap 401, an oxide layer may be formed over the physically exposed top surface 404 and the physically exposed lateral sidewall(s) 403 of the germanium-based well 30. The oxide layer may include germanium oxide. The oxide layer may have a thickness of 20 nm or more to minimize defects in the germanium-containing material of the germanium-based well 30. An etching process, such as a high-temperature hydrogen ($H_2$) etching process, may be used to remove the oxide layer from the top surface 404 of the germanium-based well 30. Then, the silicon-containing capping material may be deposited on the physically exposed top surface 404 of the germanium-based well 30, such as via an epitaxial deposition process, to form the passivation silicon region 340 over the top surface 404 of the germanium-based well 30, the exposed horizontally-extending portion of the semiconductor material layer 10, and over the top of the gap 401.

The oxide layer may remain on the lateral sidewalls 403 of the germanium-based well 30 beneath the passivation silicon region 340.

Referring again to FIG. 13, the germanium-based well 30 may include a diffusion region 410 adjacent to the lateral sidewalls 403 and the bottom surface 406 of the germanium-based well 30. The diffusion region 410 may be formed by the diffusion of dopants of the first conductivity type from the first-conductivity-type semiconductor material region 21 into the germanium-based well 30. The dopants of the first conductivity type may diffuse into the germanium-based well 30 via direct contact between the germanium-based well 30 and the first-conductivity-type semiconductor material region 21 (e.g., along the bottom surface 406 of the germanium-based well 30, and along the lateral side surfaces of the germanium-based well 30 prior to the formation of the gap 401) or indirectly by diffusion through one or more intermediate materials, such as the silicon passivation 340 or, if present, a semiconductor material liner between the first-conductivity-type semiconductor material region 21 and the germanium-based well 30.

Figure 14:
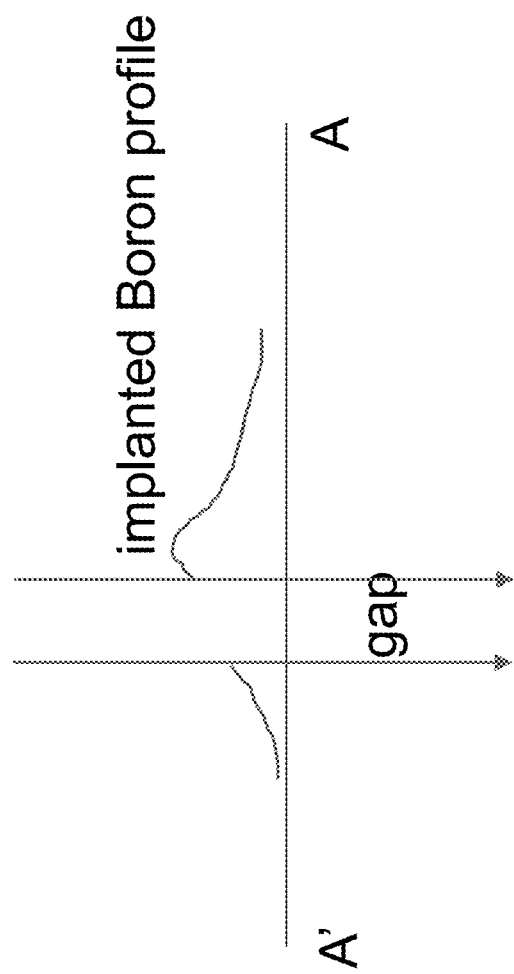
FIG. 14 is a plot of a simulation showing the concentration of dopants of a first conductivity type along line A-A' in FIG. 13.

FIG. 14 is a plot of a simulation showing the concentration of dopants of the first conductivity type (i.e., Boron) along line A-A' in FIG. 13. As shown in FIG. 14, the dopant concentration is highest in the first-conductivity-type semiconductor material region 21, but still maintains a significant dopant concentration adjacent to the lateral sidewalls 403 of the germanium-based well 30. In embodiments, the dopant concentration of the germanium-based well 30 adjacent to the lateral sidewalls 403 of the germanium-based well 30 may be at least 30%, such as at least 50%, of the dopant concentration adjacent to the sidewall 68 of the trench 69. The discontinuity in the dopant profile in which there are no dopants corresponds to the gap 401.

Figure 15:
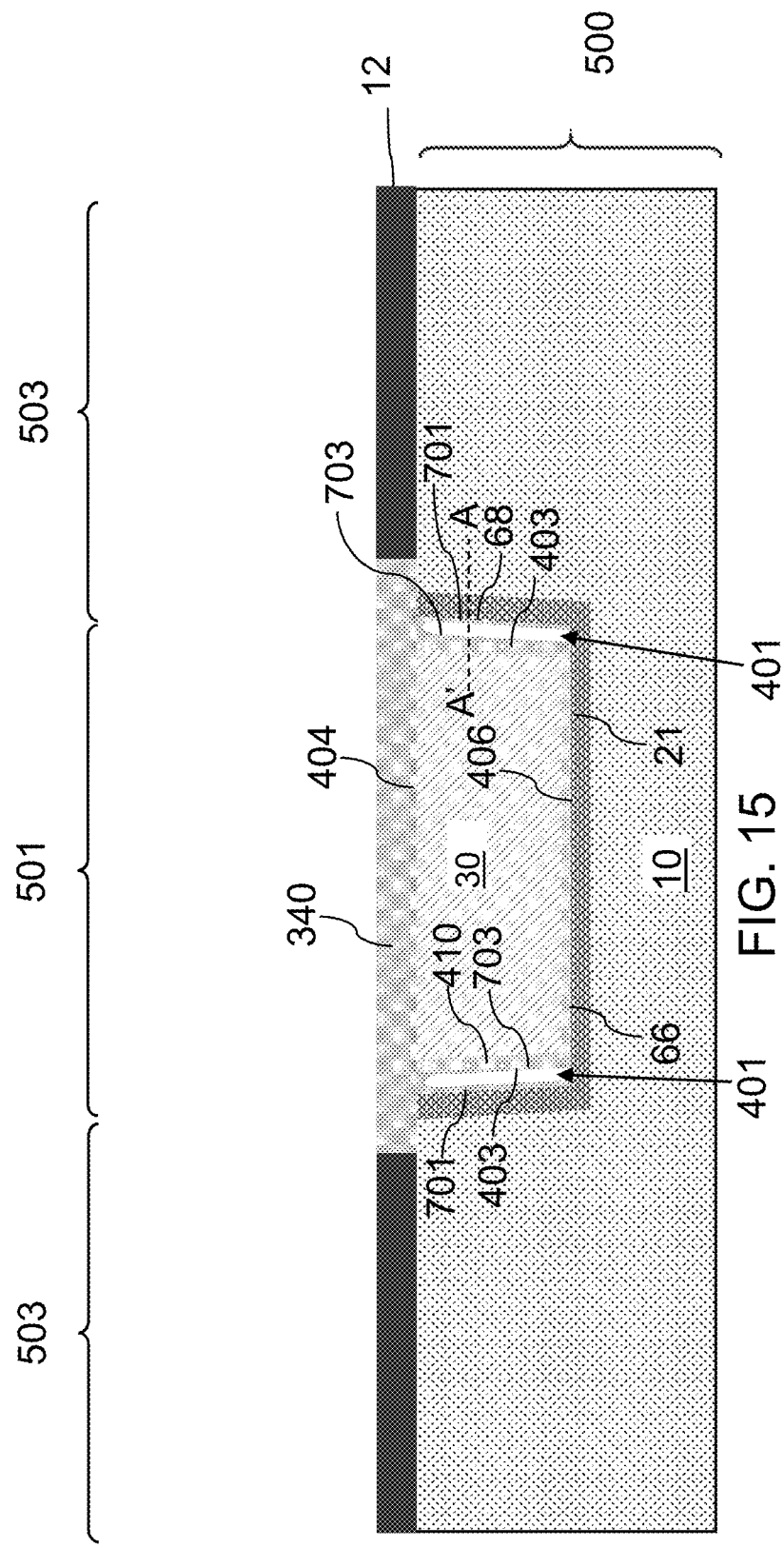
FIG. 15 is a vertical cross-sectional view of an alternative configuration of the exemplary structure of an image sensor that includes at least one germanium-based detection region that is formed in a recess in a semiconductor material substrate, according to various embodiments of the present disclosure.

FIG. 15 is a vertical cross-sectional view of an alternative configuration of the exemplary structure according an embodiment of the invention. Referring to FIG. 15, an alternative configuration of the exemplary structure shown in FIG. 13 may be derived by forming a layer 701 of a semiconductor material over the sidewall 68 of the trench 69 and forming a layer 703 of a semiconductor material over the lateral sidewall 403 of the germanium-based well 30 within the gap 401 surrounding the lateral sides of the germanium-based well 30. The layers 701 and 703 may be formed epitaxially over the sidewall 68 of the trench 69 and the lateral sidewall 403 of the germanium-based well 30 within the gap 401. The layers 701 and 703 of semiconductor material may include silicon. In some embodiments, the layers 701 and 703 may be silicon material that is formed simultaneous with the formation of the silicon-containing capping material of the passivation silicon region 340.

Referring again to FIG. 15, in various embodiments, the layers 701 and 703 may be silicon material that is formed by controlling the deposition rate of the silicon-containing capping material of the passivation silicon region 340. In particular, the silicon-containing capping material may be deposited on the physically exposed top surface 404 of the germanium-based well 30, the exposed horizontally-extending portion of the semiconductor material layer 10 surrounding the germanium-based well 30, the lateral sidewalls 403 of the germanium-based well 30, and the sidewalls 68 of the trench 69 using a relatively low deposition rate. The relatively low deposition rate may enable more of the silicon-containing capping material to form over the lateral sidewalls 403 of the germanium-based well 30 and the sidewalls 68 of the trench 69 before the silicon-containing capping material forms over the top of gap 401, thereby closing the gap 401 and inhibiting additional deposition of the silicon-containing capping material over the lateral sidewalls 403 of the germanium-based well 30 and the sidewalls 68 of the trench 69. Depositing the silicon-containing capping material with a suitably low deposition rate may enable layers 701 and 703 of silicon-containing semiconductor material to form over the sidewall 68 of the trench 69 and the lateral sidewall 403 of the germanium-based well 30 prior to the gap 401 being closed, as shown in FIG. 15. In contrast, depositing the silicon-containing capping material with a relatively high deposition rate may limit the amount of silicon-containing semiconductor material that is able to form over the sidewall 68 of the trench 69 and the lateral sidewall 403 of the germanium-based well 30 before the silicon-containing capping material forms over the top of the gap 401. Depositing the silicon-capping semiconductor material with a suitably high deposition rate may produce a configuration of the exemplary structure as shown in FIG. 13, which may lack layers 701 and 703 over the sidewalls 68 of the trench 69 and the lateral sidewalls 403 of the germanium-based well 30, respectively. In various embodiments, the silicon-capping semiconductor material may be deposited with a deposition rate of at least about 2.4 nm/minute to form an exemplary structure as shown in FIG. 13, which may lack layers 701 and 703 over the sidewalls 68 of the trench 69 and the lateral sidewalls 403 of the germanium-based well 30, respectively. In contrast, the silicon-capping semiconductor material may be deposited with a lower deposition rate, such as 2.2 nm/minute or less, including deposition rates between 0.1 nm/minute and 2.0 nm/minute, to form an exemplary structure as shown in FIG. 15 that includes layers 701 and 703 of silicon-containing semiconductor material over the sidewalls 68 of the trench 69 and the lateral sidewalls 403 of the germanium-based well 30, respectively.

Figure 16:
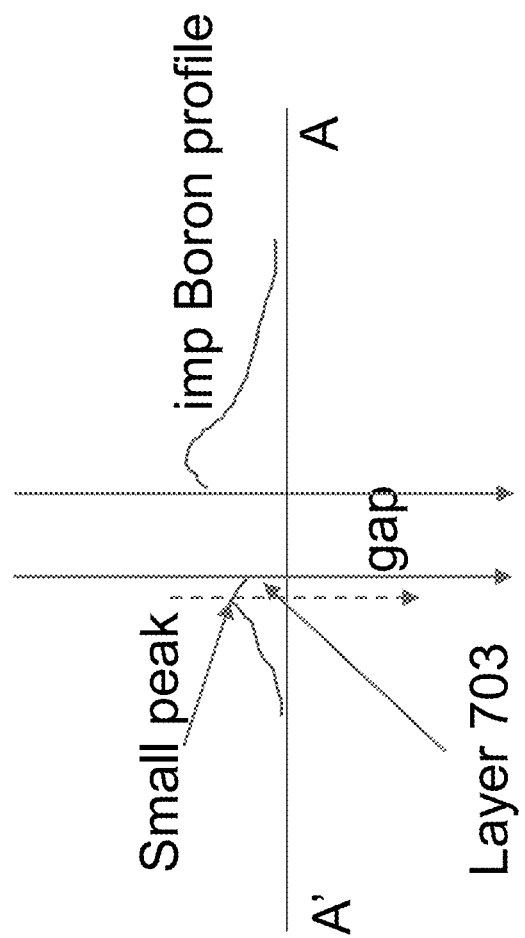
FIG. 16 is a plot of a simulation showing the concentration of dopants of a first conductivity type along line A-A' in FIG. 15.

FIG. 16 is a plot of a simulation showing the concentration of dopants of the first conductivity type (i.e., Boron) along line A-A' in FIG. 15. As shown in FIG. 16, the dopant concentration is highest in the first-conductivity-type semiconductor material region 21. There is a discontinuity in which there are no dopants corresponding to the gap 401. Then, the dopant concentration increases throughout the layer 703 of semiconductor material (i.e., silicon) formed over the lateral sidewall 403 of the germanium-based well 30 within the gap 401, and reaches a secondary peak at the interface between the layer 703 of semiconductor material and the lateral sidewall 403 of the germanium-based well 30. In embodiments, the dopant concentration at the interface between the layer 703 of semiconductor material and the lateral sidewall 403 of the germanium-based well 30 may be at least 40%, such as at least 50%, including at least 60% of the dopant concentration adjacent to the sidewall 68 of the trench 69.

Figure 17:
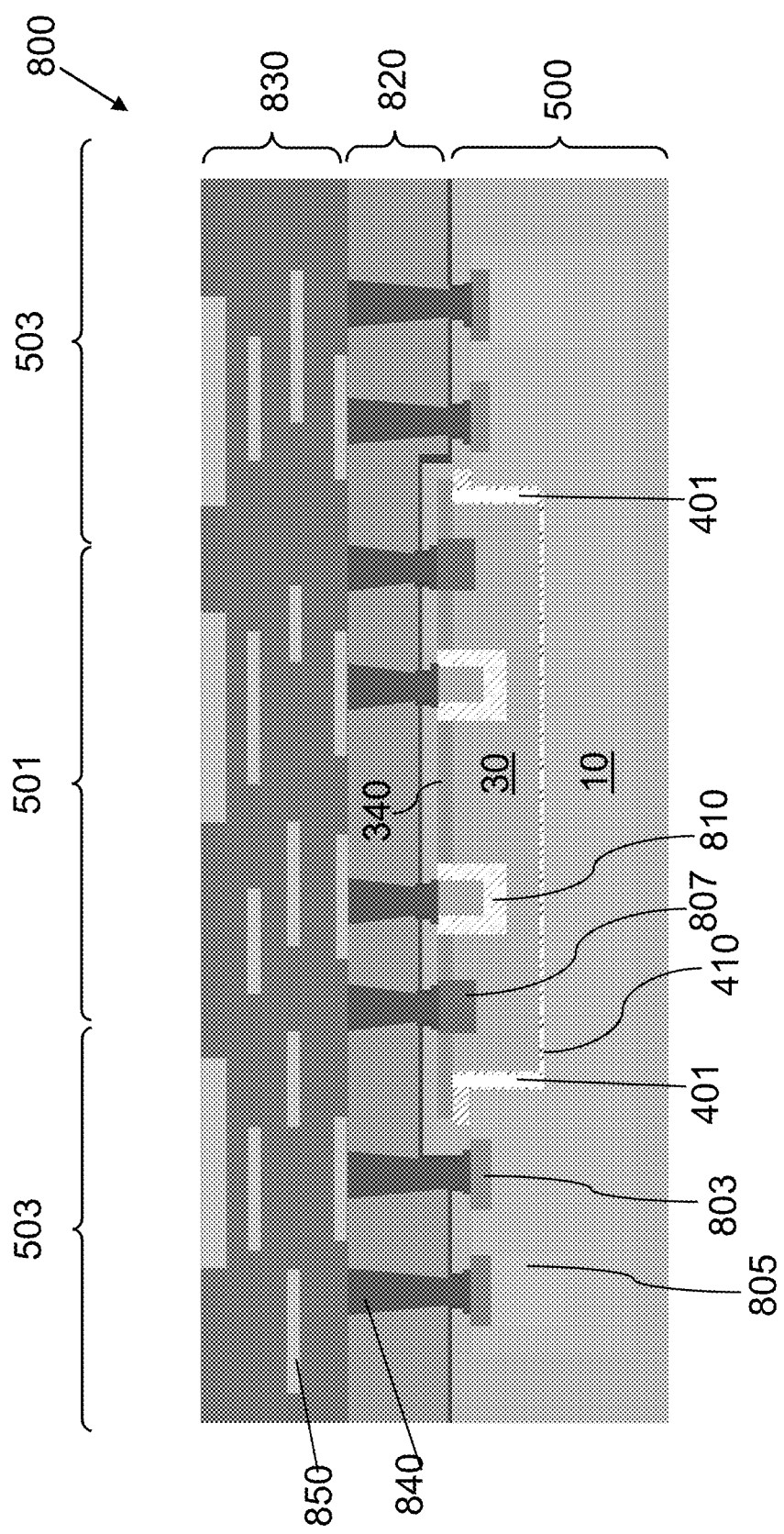
FIG. 17 is a vertical cross-sectional view of a photodetector including a germanium-based detection region that is formed in a recess in a semiconductor material substrate according to various embodiments of the present disclosure.

FIG. 17 is a vertical cross-sectional view of a photodetector 800 including a germanium-based detection region 501 that may be formed in a recess in a semiconductor material substrate 500. The photodetector 800 may include an exemplary structure as shown in FIG. 13 and/or FIG. 15, and may include a germanium-based well 30 embedded in a semiconductor material layer 10 of the substrate 500, where a gap 401 surrounds the lateral side surface of the germanium-based well 30. In embodiments, the germanium-based well 30 may include a germanium-containing material that includes germanium at an atomic percentage greater than 50%, and the semiconductor material layer 10 includes second semiconductor material that includes germanium at an atomic percentage between 0% and 50%. In various embodiments, the second semiconductor material layer 10 may be a silicon-containing material that includes silicon at an atomic percentage greater than 50%. The germanium-based well 30 may contact the second semiconductor material on a bottom surface of the germanium-based well 30, but may not contact the second semiconductor material around the lateral side surfaces of the germanium based well.

The semiconductor material layer 10 and the germanium-based well 30 may include a plurality of doped regions, which may include doped wells 805, 807, 810 and/or doped contact regions 803. The doped regions may include dopants of the first conductivity type or dopants of the second conductivity type. In embodiments, the germanium-based well 30 may include at least one doped region of the first conductivity type 410 and at least one doped well region of the second conductivity type 810 such that a photovoltaic junction, such as a p-i-n junction or p-n junction, is formed within the germanium-based well 30.

The photodetector 800 may also include one or more dielectric material layers 820, 830 and metal interconnect structures 840, 850 formed over the semiconductor material layer 10 and the germanium-based well 30. Each of the dielectric material layers 820, 830 may include a respective interlayer dielectric (ILD) material such as undoped silicate glass, a doped silicate glass, organosilicate glass, and/or a porous dielectric material. The dielectric material layers 820, 830 may include dielectric liners such as silicon nitride dielectric liners, dielectric metal oxide dielectric liners, silicon carbide dielectric liners, and/or silicon oxynitride dielectric liners. The metal interconnect structures 840, 850 may include metal via structures 840 and metal line structures 850.

Figure 18:
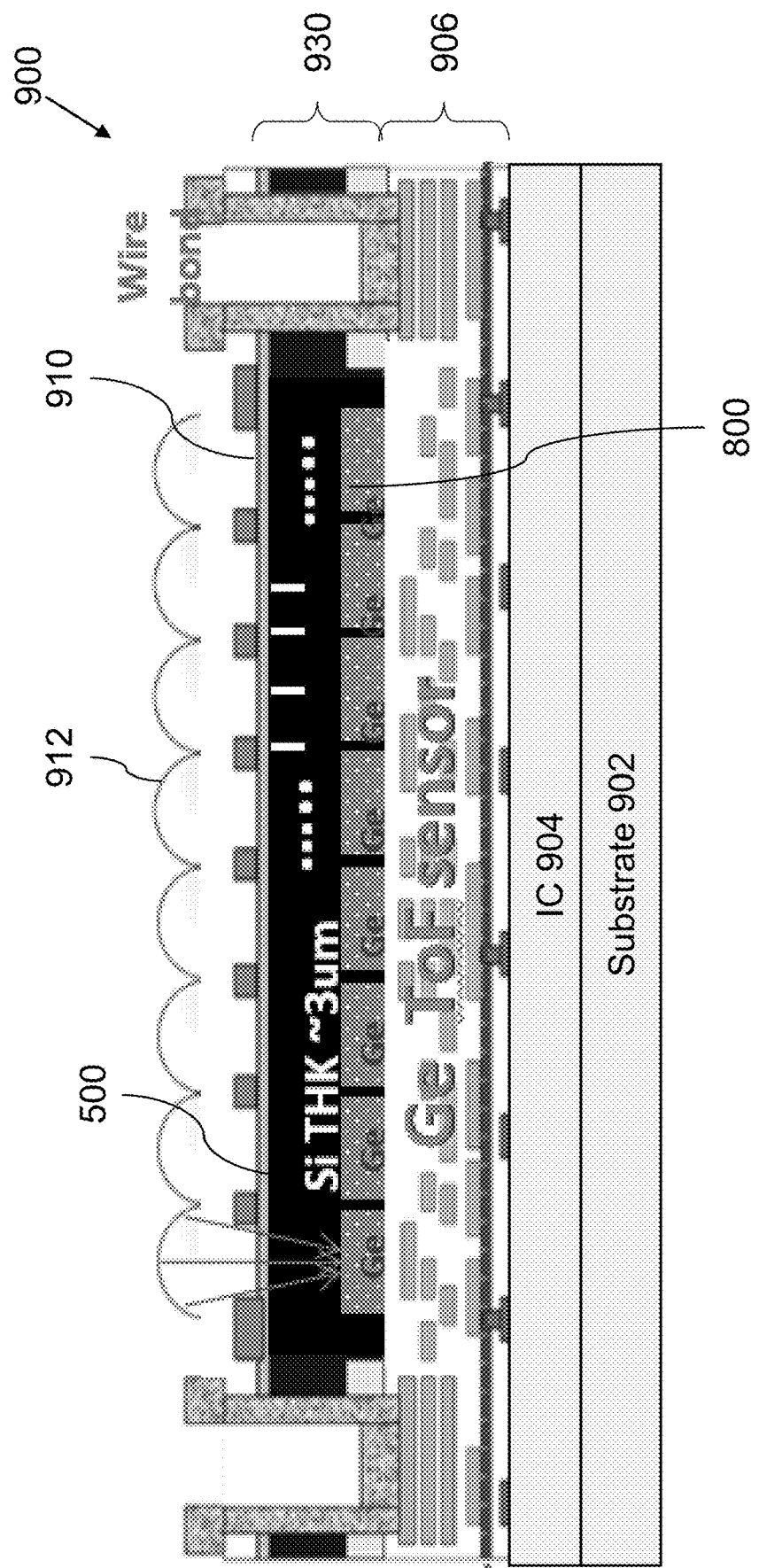
FIG. 18 is a vertical cross-sectional view of an image sensor according to various embodiments of the present disclosure.

FIG. 18 is a vertical cross-sectional view of an image sensor 900, according to various embodiments of the present disclosure. Referring to FIG. 18, the image sensor 900 may be an image sensor for a time-of-flight (TOF) detection system, such as a direct time-of-flight (dToF) detection system or an indirect time-of flight (iToF) detection system.

The image sensor 900 may include a carrier substrate 902, an integrated circuit layer 904, an interconnect layer 906, a sensor layer 930, a filter layer 910, and a lens layer 912. In general, light of a single wavelength or multiple wavelengths may enter the lenses of the lens layer 912. In coming light that is to be detected by the photodetector sensors may be focused, collimated, expanded, or processed according to the lens design at the lens layer 912. The incoming detected light may then enter the filter layer 910. The filter layer 910 may be configured to pass light having a specific wavelength range where it may impinge on photodetectors of the sensor layer 930. Photodetectors in the sensor layer 930 may convert the incident light into free carriers. The integrated circuit layer 904 may collect the free carriers through the interconnect layer 906 and process the free carriers according to the specific application.

In general, the carrier substrate 902 may be a silicon substrate, a silicon-on-insulator (SOI) substrate, or any other suitable carrier substrate materials. The integrated circuits of the integrated circuit layer 904 and wiring of the interconnect layer 906 may be fabricated using CMOS processing techniques. For example, the wiring may be formed by dry-etching a contact hole through a dielectric layer and filling the contact hole with a metal material using chemical vapor deposition (CVD). Furthermore, the shape of the lenses of the lens layer 912 may be concave, convex, planar with surface structure, or other shapes, and should not be limited by the exemplary drawings here.

The sensor layer 930 may include a plurality of photodetectors, such as photodetector 800 shown in FIG. 17. The photodetectors 800 may be arranged in an array pattern and may be fabricated on a common substrate 500. Thus, the image sensor 900 may include an array of photodetectors 800. The dielectric material layers 820, 830 and metal interconnect structures 840, 850 as shown in FIG. 17 may form part or all of the interconnect layer 906 of FIG. 18. At least one of the photodetectors 800 of the sensor layer 930 may include an exemplary structure as shown in FIG. 13 and/or FIG. 15, and may include a germanium-based well 30 embedded in a semiconductor material layer 10 of the substrate 500, where a gap 401 surrounds the lateral side surface of the germanium-based well 30. In the embodiment of FIG. 18, the substrate 500 is inverted relative to the view shown in FIG. 17 such that incident light enters the photodetector 800 through the back side of the substrate 500.

The sensor layer 930 may include multiple groups of photodetector sensors for detecting light of different wavelength ranges. For example, a first group of one or more photodetectors 800 of the sensor layer 930 may include an exemplary structure as shown in FIG. 13 and/or FIG. 15 and may be configured to detect light in an infrared wavelength range, such as a near infrared (NIR) wavelength range (e.g., 810 nm to 1500 nm). Although not shown, the sensor layer 930 may include photodetector sensors configured to detect light of a blue wavelength range (e.g., 420 nm to 500 nm), a green wavelength range (e.g., 500 nm to 580 nm), and/or a red wavelength range (e.g., 580 nm to 660 nm). Each photodetector may be isolated by insulating sidewall spacers, trenches, or other suitable isolation structures. In some implementations, the groups of photodetector sensors that are configured to detect visible light (e.g., red, green, and blue) may be silicon photodetector sensors.

Figure 19:
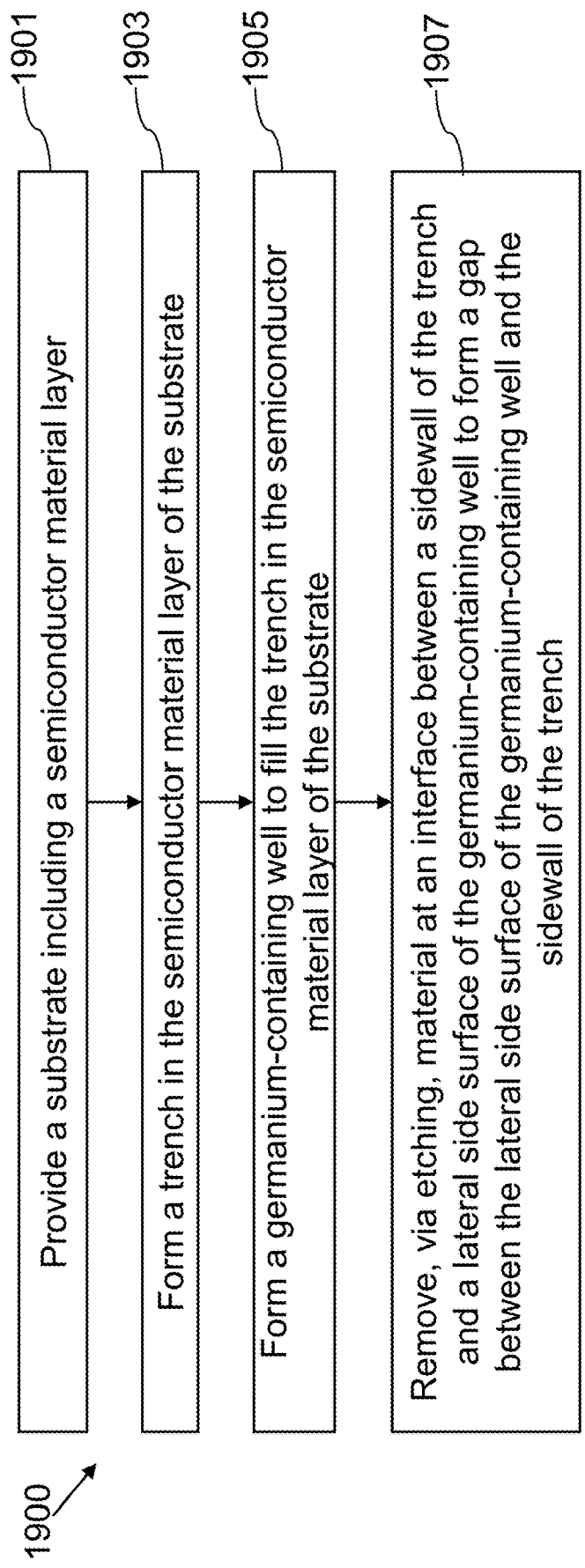
FIG. 19 is a flowchart illustrating a general method of fabricating a photodetector having a germanium-based detection region according to various embodiments.

FIG. 19 is a flowchart illustrating a general method 1900 of fabricating a photodetector having a germanium-based detection region according to various embodiments. Referring to FIG. 1, in step 1901 of method 1900, a substrate 500 including a semiconductor material layer 10 may be provided. Referring to FIGS. 2-7, in step 1903, a trench 69 may be formed in the semiconductor material layer 10 of the substrate 500. Referring to FIGS. 8-10, in step 1905, a germanium-containing well 30 may be formed to fill the trench 69 in the semiconductor material layer 10 of the substrate 500. Referring to FIGS. 11-13 and 15, in step 1907, material at an interface between a sidewall 68 of the trench 69 and a lateral side surface 403 of the germanium-containing well 30 may be removed by etching to form a gap 401 between the lateral side surface 403 of the germanium-containing well 30 and a sidewall 68 of the trench 69.

Referring to all drawings and according to various embodiments of the present disclosure, a photodetector 800 includes a substrate 500 including a semiconductor material layer 10; and a germanium-based well 30 embedded in the semiconductor material layer 10 of the substrate 500, wherein a gap 401 is located between a lateral side surface 403 of the germanium-based well 30 and the surrounding semiconductor material layer 10.

In one embodiment, the germanium-based well 30 includes a germanium-containing material that includes germanium at an atomic percentage greater than 50%.

In one embodiment, the semiconductor material layer 10 of the substrate 500 includes a second semiconductor material that includes germanium at an atomic percentage between 0% and 50%.

In one embodiment, the semiconductor material layer 10 of the substrate 500 is a silicon-containing material that includes silicon at an atomic percentage greater than 50%.

In one embodiment, the germanium-based well 30 contacts the second semiconductor material of the semiconductor material layer 10 on a bottom surface 406 of the germanium-based well 30 and is removed from the second semiconductor material of the semiconductor material layer 10 on a lateral side surface 403 of the germanium-based well 30.

In one embodiment, the semiconductor material layer 10 includes a trench 69 having at least one sidewall 68, and the gap 401 is located between the at least one sidewall 68 of the trench 69 and the lateral side surface 403 of the germanium-based well 30.

In one embodiment, the photodetector 800 includes a first silicon-containing semiconductor layer 701 over the at least one sidewall 68 of the trench 69 and a second silicon-containing semiconductor layer 703 over the lateral side surface 403 of the germanium-based well 30, wherein the gap 401 is located between the first silicon-containing semiconductor layer 701 and the second silicon-containing semiconductor layer 703.

In one embodiment, the gap 401 has a width of at least 0.5 nm.

In one embodiment, the gap 401 has a width between 1 nm and 1000 nm.

In one embodiment, the germanium-based well 30 has a cuboid shape that includes four lateral sidewalls 403, and the gap 401 surrounds each of the lateral sidewalls 403 of the germanium-based well 30 and has a width that is at least 0.5 nm and is less than one-half of a sum of a length dimension and a width dimension of the germanium-based well 30 along a horizontal cross-section of the germanium-based well 30.

In one embodiment, the germanium-based well 30 has a cylindrical shape that includes a lateral sidewall 403 having a curved shape, and the gap 401 completely surrounds the lateral sidewall 403 of the germanium-based well 30 and has a width that is at least 0.5 nm and is less than a radius of the cylindrically-shaped germanium-based well 30 along a horizontal cross-section of the germanium-based well 30.

In one embodiment, the photodetector 800 includes a photovoltaic junction 410, 810 formed in the germanium-based well 30.

In one embodiment, the photodetector 800 includes a passivation silicon region 340 over a top surface 404 of the germanium-based well 30 and a top portion of the gap 401 between the lateral side surface 403 of the germanium-based well 30 and the surrounding semiconductor material layer 10.

In one embodiment, the germanium-containing well 30 includes a diffusion region 410 having dopants of a first conductivity type located adjacent to the lateral side surface 403 and a bottom surface 406 of the germanium-containing well 30.

Another embodiment is drawn to an image sensor 900 that includes an array of photodetectors 800 in sensor layer 930 on a substrate 500 including a semiconductor material layer 10, where at least one photodetector 800 of the array of photodetectors 800 in sensor layer 930 includes a germanium-based well 30 embedded in the semiconductor material layer 10 of the substrate 500, and a gap 401 is located between a lateral side surface 403 of the germanium-based well 30 and the surrounding semiconductor material layer 10.

In one embodiment, the array of photodetectors 800 in sensor layer 930 includes a plurality of photodetectors 800 having a germanium-based well 30 embedded in the semiconductor material layer 10 of the substrate 500, where a gap 401 is located between a lateral side surface 403 of each of the germanium-based wells 30 and the surrounding semiconductor material layer 10, and the image sensor 900 further includes a lens layer 912 optically coupled to the array of photodetectors 800 in sensor layer 930, a filter layer 910 optically coupled to the lens layer 912 and to the array 930 of photodetectors 800, the filter layer 910 configured to allow light having a particular wavelength range to pass through the filter layer 910 and impinge on the photodetectors 800, and an integrated circuit 904, coupled to the array of photodetectors 800 in sensor layer 930, and configured to collect free carriers generated by each of the photodetectors 800 in response to light impinging on the photodetectors 800.

In one embodiment, the image sensor 900 is a Time of Flight (ToF) image sensor that is configured to detect light in the near infrared wavelength range.

Another embodiment is drawn to a method of fabricating a photodetector 800 having a germanium-based detection region 501 that includes providing a semiconductor substrate 500 including a semiconductor material layer 10, forming a trench 69 in the semiconductor material layer 10 of the substrate 500, forming a germanium-containing well 30 to fill the trench 69 in the semiconductor material layer 10 of the substrate 500, and removing, by etching, material at an interface between a sidewall 68 of the trench 69 and a lateral side surface 403 of the germanium-containing well 30 to form a gap 401 between the lateral side surface 403 of the germanium-containing well 30 and the sidewall 68 of the trench 69.

In one embodiment, the method further includes implanting dopants of a first conductivity type into the semiconductor material layer 10 of the substrate 500 through the sidewall 68 of the trench 69 and into a horizontal portion of the semiconductor material layer 10 that underlies a bottom surface 66 of the trench 69 prior to forming the germanium-containing well 30, and forming a passivation silicon region 340 over a top surface 404 of the germanium-containing well 30 and over a top portion of the gap 401 between the lateral side surface 403 of the germanium-containing well 30 and the sidewall 68 of the trench 69, wherein the germanium-containing well 30 includes a diffusion region 410 adjacent to the lateral side surface 403 of the germanium-containing well 30 and adjacent to a bottom surface 406 of the germanium-containing well 30, the diffusion region 410 including dopants of the first conductivity type that are diffused from the semiconductor material layer 10 into the germanium-containing well 30.

In one embodiment, the method further includes forming a first silicon-containing semiconductor layer 701 over the at least one sidewall 68 of the trench 69, and forming a second silicon-containing semiconductor layer 703 over the lateral side surface 403 of the germanium-based well 30, wherein the gap 401 is located between the first silicon-containing semiconductor layer 701 and the second silicon-containing semiconductor layer 703.

By forming a germanium-containing photodetector 800 that includes a gap 401 around a lateral side surface 403 of a germanium-based well 30 embedded in a semiconductor material layer 10, the surface contact area between the germanium-containing material of the germanium-based well 30 and the surrounding semiconductor material, which may be a silicon-based material, may be reduced. This may minimize the formation of crystal defects, such as slips, in the germanium-based well 30, and thereby reduce the dark current and improve photodetector performance.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A photodetector, comprising:
a substrate including a semiconductor material layer;
a germanium-based well embedded in the semiconductor material layer of the substrate, the germanium-based well comprising a diffusion region having dopants of a first conductivity type located adjacent to a lateral side surface and a bottom surface of the germanium-based well, wherein a gap is located between the lateral side surface of the germanium-based well and a sidewall of the surrounding semiconductor material layer; and
a passivation layer comprising silicon over a top surface of the germanium-based well, a top surface of the semiconductor material layer, and a top portion of the gap between the lateral side surface of the germanium-based well and the sidewall of the surrounding semiconductor material layer, wherein the gap comprises an air gap having an upper surface formed by the passivation layer, at least a portion of the passivation layer comprises dopants of the first conductivity type, and the passivation layer comprising silicon extends over at least a portion of the lateral side surface of the germanium-based well, and the portion of the passivation layer extending over at least a portion of the lateral side surface of the germanium-based well comprises dopants of the first conductivity type.

2. The photodetector of claim 1, wherein the germanium-based well includes a germanium-containing material that includes germanium at an atomic percentage greater than 50%.

3. The photodetector of claim 2, wherein the semiconductor material layer of the substrate comprises an atomic percentage of germanium that is between 0% and 50%.

4. The photodetector of claim 3, wherein the semiconductor material layer of the substrate is a silicon-containing material that includes silicon at an atomic percentage greater than 50%.

5. The photodetector of claim 3, wherein the germanium-based well contacts the semiconductor material layer of the substrate on a bottom surface of the germanium-based well and is removed from the semiconductor material layer of the substrate on a lateral side surface of the germanium-based well.

6. The photodetector of claim 1, wherein the gap has a width of at least 0.5 nm.

7. The photodetector of claim 1, wherein the gap has a width between 1 nm and 1000 nm.

8. The photodetector of claim 1, wherein the germanium-based well has a cuboid shape that includes four lateral sidewalls, and the gap surrounds each of the lateral sidewalls of the germanium-based well and has a width that is at least 0.5 nm and is less than one-half of a sum of a length dimension and a width dimension of the germanium-based well along a horizontal cross-section of the germanium-based well.

9. The photodetector of claim 1, wherein the germanium-based well has a cylindrical shape that includes a lateral sidewall having a curved shape, and the gap completely surrounds the lateral sidewall of the germanium-based well and has a width that is at least 0.5 nm and is less than a radius of the cylindrically-shaped germanium-based well along a horizontal cross-section of the germanium-based well.

10. The photodetector of claim 1, further comprising a photovoltaic junction formed in the germanium-based well.

11. The photodetector of claim 1, wherein a doping concentration of the dopants of the first conductivity type in the portion of the passivation layer over the lateral side surface of the germanium-based well increases between a first surface of the portion of the passivation layer closest to the air gap and a second surface of the portion of the passivation layer closest to the lateral side surface of the germanium-based well.

12. The photodetector of claim 11, wherein the dopants of the first conductivity type comprise boron.

13. The photodetector of claim 1, further comprising:
a hard mask layer comprising a dielectric material over the semiconductor material layer of the substrate and laterally surrounding the passivation layer.

14. An image sensor, comprising:
an array of photodetectors on a substrate comprising a semiconductor material layer, wherein at least one photodetector of the array of photodetectors comprises:
a germanium-based well embedded in the semiconductor material layer of the substrate, the germanium-based well comprising a diffusion region having dopants of a first conductivity type located adjacent to a lateral side surface and a bottom surface of the germanium-based well;
a gap located between a lateral side surface of the germanium-based well and a sidewall of the surrounding semiconductor material layer; and
a passivation layer comprising silicon over a top surface of the germanium-based well, a top surface of the semiconductor material layer, and a top portion of the gap between the lateral side surface of the germanium-based well and the sidewall of the surrounding semiconductor material layer, wherein the gap comprises an air gap having an upper surface formed by the passivation layer, at least a portion of the passivation layer comprises dopants of the first conductivity type and the passivation layer comprising silicon extends over at least a portion of the lateral side surface of the germanium-based well, and the portion of the passivation layer extending over at least a portion of the lateral side surface of the germanium-based well comprises dopants of the first conductivity type.

15. The image sensor of claim 14, wherein the array of photodetectors comprises a plurality of photodetectors including a germanium-based well embedded in the semiconductor material layer of the substrate, where a gap is located between a lateral side surface of each of the germanium-based wells and the surrounding semiconductor material layer, and the image sensor further comprises:
a lens layer optically coupled to the array of photodetectors;
a filter layer optically coupled to the lens layer and to the array of photodetectors, the filter layer configured to allow light having a particular wavelength range to pass through the filter layer and impinge on a photodetector of the array of photodetectors; and an integrated circuit, coupled to the array of photodetectors, and configured to collect free carriers generated by each of the photodetectors in response to light impinging on the photodetectors.

16. The image sensor of claim 15, wherein the image sensor is a Time of Flight (ToF) image sensor that is configured to detect light in the near infrared wavelength range.

17. A photodetector, comprising:

a first semiconductor material layer;

a well comprising a second semiconductor material embedded in the first semiconductor material layer, wherein the second semiconductor material has a different composition than the first semiconductor material layer, the well comprises a diffusion region having dopants of a first conductivity type located adjacent to a lateral side surface and a bottom surface of the well, and a gap having a width of at least 0.5 nm laterally surrounds the well;

a passivation layer comprising silicon over a top surface of the well, a top surface of the first semiconductor material layer, and a top portion of the gap laterally surrounding the well, wherein the gap comprises an air gap having an upper surface formed by the passivation layer, and at least a portion of the passivation layer comprises dopants of the first conductivity type; and a hard mask layer comprising a dielectric material over the first semiconductor material layer and laterally surrounding the passivation layer.

18. The photodetector of claim 17, wherein the first semiconductor material layer comprises silicon and the second semiconductor material comprises germanium.

19. The photodetector of claim 17, wherein the well comprises a photovoltaic junction.

20. The photodetector of claim 17, wherein the passivation layer comprising silicon extends over at least a portion of the lateral side surface of the well, and the portion of the passivation layer extending over at least a portion of the lateral side surface of the well comprises dopants of the first conductivity type.

* * * * *